United States Patent
Lee et al.

(10) Patent No.: US 12,446,354 B2
(45) Date of Patent: Oct. 14, 2025

(54) SINGLE-PHOTON DETECTION ELEMENT, ELECTRONIC DEVICE, AND LIDAR DEVICE

(71) Applicant: TRUPIXEL INC., Daejeon (KR)

(72) Inventors: Myung-Jae Lee, Seoul (KR); In-Ho Lee, Seoul (KR)

(73) Assignee: TRUPIXEL INC., Daejeon (KR)

( * ) Notice: Subject to any disclaimer, the term of this patent is extended or adjusted under 35 U.S.C. 154(b) by 539 days.

(21) Appl. No.: 17/979,228

(22) Filed: Nov. 2, 2022

(65) Prior Publication Data

US 2023/0420584 A1    Dec. 28, 2023

(30) Foreign Application Priority Data

Jun. 24, 2022  (KR) .................. 10-2022-0077706

(51) Int. Cl.
| | | |
|---|---|---|
| *H10F 77/70* | (2025.01) | |
| *H10F 30/225* | (2025.01) | |
| *H10F 77/40* | (2025.01) | |
| *B82Y 20/00* | (2011.01) | |
| *G01S 7/481* | (2006.01) | |

(52) U.S. Cl.
CPC .......... *H10F 77/70* (2025.01); *H10F 30/225* (2025.01); *H10F 77/413* (2025.01); *B82Y 20/00* (2013.01); *G01S 7/4816* (2013.01)

(58) Field of Classification Search
CPC ....... H10F 77/70; H10F 30/225; H10F 77/413
See application file for complete search history.

(56) References Cited

U.S. PATENT DOCUMENTS

| | | |
|---|---|---|
| 10,438,987 B2 | 10/2019 | Mandai et al. |
| 2010/0019295 A1 | 1/2010 | Henderson et al. |
| 2010/0327387 A1 | 12/2010 | Kasai et al. |
| 2015/0340391 A1 | 11/2015 | Webster |
| 2017/0062644 A1 | 3/2017 | Koizumi et al. |
| 2017/0199078 A1 | 7/2017 | Huang et al. |
| 2019/0172860 A1 | 6/2019 | Von Kanel |
| 2020/0091208 A1 | 3/2020 | Otake et al. |
| 2020/0116558 A1 | 4/2020 | Pacala et al. |

(Continued)

FOREIGN PATENT DOCUMENTS

| | | |
|---|---|---|
| JP | 2011-9749 A | 1/2011 |
| JP | 2017-45802 A | 3/2017 |
| JP | 2020-170812 A | 10/2020 |

(Continued)

OTHER PUBLICATIONS

International Search Report issued on Oct. 12, 2023, in counterpart International Patent Application No. PCT/KR2023/008787 (3 pages in Korean).

(Continued)

*Primary Examiner* — Samuel A Gebremariam
(74) *Attorney, Agent, or Firm* — NSIP Law

(57) ABSTRACT

A single-photon detection element includes a substrate including a first surface and a second surface located opposite to each other, and a plurality of plasmonic nanopatterns provided on the second surface, wherein the substrate includes a high-concentration doping region provided adjacent to the first surface, a substrate region provided between the high-concentration doping region and the plurality of plasmonic nanopatterns, and a first well provided between the substrate region and the high-concentration doping region.

20 Claims, 22 Drawing Sheets

(56) References Cited

U.S. PATENT DOCUMENTS

2021/0296377 A1  9/2021  Lu et al.
2022/0165902 A1  5/2022  Okazaki et al.

FOREIGN PATENT DOCUMENTS

| KR | 10-1805385 B1 | 12/2017 |
| KR | 10-2021-0055750 A | 5/2021 |
| KR | 10-2022-0069125 A | 5/2022 |
| WO | WO 2019/002252 A1 | 1/2019 |
| WO | WO 2020/053564 A1 | 3/2020 |

OTHER PUBLICATIONS

Written Opinion of the International Searching Authority issued on Oct. 12, 2023, in counterpart International Patent Application No. PCT/KR2023/008787 (4 pages in Korean).

SINGLE-PHOTON DETECTION ELEMENT, ELECTRONIC DEVICE, AND LIDAR DEVICE

CROSS-REFERENCE TO RELATED APPLICATION

This application is based on and claims priority under 35 U.S.C. § 119 to Korean Patent Application No. 10-2022-0077706, filed on Jun. 24, 2022, in the Korean Intellectual Property Office, the disclosure of which is incorporated by reference herein in its entirety.

BACKGROUND

1. Field

The disclosure relates to a single-photon detection element, an electronic device, and a LiDAR device.

2. Description of the Related Art

An avalanche photodiode (APD) is a solid-state photodetector in which a high reverse bias voltage is applied to a p-n junction to provide a high first stage gain by avalanche multiplication. When an incident photon with sufficient energy to emit carrier reaches a photodiode, an electron-hole pair (EHP) is generated. A high electric field rapidly accelerates photo-generated electrons toward an anode (+). Additional electron-hole pairs are sequentially generated due to impact ionization caused by the accelerated electrons. All of the electrons generated through the above process are accelerated toward the anode. Likewise, photo-generated holes can be rapidly accelerated toward a cathode (−), and the same phenomenon as above occurs. Accordingly, an APD is a semiconductor-based device that operates in a similar manner to that of a photomultiplier tube. A linear-mode APD is an effective amplifier in which a gain may be set by controlling a bias voltage and a gain of tens to thousands may be achieved in a linear mode.

A single-photon avalanche diode (SPAD) is an APD that operates in a Geiger mode under the applied bias above the breakdown voltage of a semiconductor across the p-n junction, so that a single incident photon may trigger an avalanche breakdown to generate a very large current and thus an easily measurable pulse signal may be obtained along with a quenching resistor or circuit. That is, the SPAD operates as a device that generates a large pulse signal through a very large gain when compared to a linear-mode APD in which a gain may not be sufficient at a low light intensity. After the avalanche multiplication is triggered, the quenching resistor or quenching circuit is used to reduce a bias voltage below the breakdown voltage in order to quench an avalanche process. Once the avalanche process is quenched, the bias voltage is raised again above the breakdown voltage to reset the SPAD for detection of another photon. This process may be referred to as a process of re-biasing or recharging the SPAD.

A SPAD may include a quenching resistor or quenching circuit, a recharge circuit, a memory, a gate circuit, a counter, a time-to-digital converter, and the like, and because a SPAD pixel is semiconductor-based, SPAD pixels may be easily configured in an array.

SUMMARY

Provided is a single-photon detection element, an electronic device, and a light detection and ranging (LiDAR) device in which a photon with energy lower than a bandgap of a material of a semiconductor substrate may be detected.

Provided is a single-photon detection element, an electronic device, and a LiDAR device in which short-wavelength infrared rays may be detected.

Provided is a single-photon detection element, an electronic device, and a LiDAR device having better near-infrared efficiency.

However, the embodiments are examples and do not limit the scope of the disclosure.

Additional aspects will be set forth in part in the description which follows and, in part, will be apparent from the description, or may be learned by practice of the presented embodiments.

According to an aspect of the disclosure, a single-photon detection element includes a substrate including a first surface and a second surface located opposite to each other, and a plurality of plasmonic nanopatterns provided on the second surface, wherein the substrate further includes a high-concentration doping region provided adjacent to the first surface, a substrate region provided between the high-concentration doping region and the plurality of plasmonic nanopatterns, and a first well provided between the substrate region and the high-concentration doping region, wherein the first well has a first conductivity type, and the high-concentration doping region has a second conductivity type different from the first conductivity type.

The second surface may be exposed between the plurality of plasmonic nanopatterns.

The plurality of plasmonic nanopatterns may protrude from the second surface.

A width of each of the plurality of plasmonic nanopatterns may range from several nanometers (nm) to several micrometers (μm).

The second surface may include a plurality of concave portions and a connection portion provided between the plurality of concave portions, and the plurality of plasmonic nanopatterns may be respectively provided in the plurality of concave portions.

The plurality of plasmonic nanopatterns conformably may cover the plurality of concave portions.

The single-photon detection element may further include a connection film provided on the connection portion, wherein the connection film connects the plurality of plasmonic nanopatterns to each other.

The plurality of plasmonic nanopatterns and the connection film may be formed as a single structure.

The single-photon detection element may further include an intermediate layer provided between the plurality of plasmonic nanopatterns and the second surface, wherein the intermediate layer includes at least one of an insulating film, an oxide thin film, and a two-dimensional (2D) material film.

The single-photon detection element may further include a transparent electrode provided on the plurality of plasmonic nanopatterns, wherein the transparent electrode electrically connects the plurality of plasmonic nanopatterns to each other.

The single-photon detection element may further include an additional layer provided on the plurality of plasmonic nanopatterns, wherein the additional layer improves light absorption characteristics of the plurality of plasmonic nanopatterns.

A voltage may be applied to at least one of the plurality of plasmonic nanopatterns.

The single-photon detection element may further include a connection layer provided on the first surface, and a control layer provided opposite to the substrate with the connection layer therebetween, wherein the control layer includes a circuit, and the connection layer includes a first conductive line that electrically connects the high-concentration doping region to the circuit, and a second conductive line that electrically connects the substrate region to the circuit, wherein the circuit includes a quenching circuit and a pixel circuit.

The single-photon detection element may further include a second well provided between the high-concentration doping region and the first well, wherein the second well has the second conductivity type, and a doping concentration of the second well is lower than a doping concentration of the high-concentration doping region.

The single-photon detection element may further include a contact region provided on a side surface of the high-concentration doping region, wherein the contact region has the first conductivity type.

The single-photon detection element may further include a guard ring provided on a side surface of the first well, wherein the guard ring has the second conductivity type.

The high-concentration doping region may be spaced apart from the substrate region by the first well.

A width of the high-concentration doping region may be greater than a width of the first well.

The substrate may include an additional doping region adjacent to the second surface, wherein charge injection characteristics of carriers excited in the plurality of plasmonic nanopatterns into the substrate are adjusted according to the additional doping region.

According to another aspect of the disclosure, an electronic device includes a single-photon detection element, wherein the single-photon detection element includes a substrate having a first surface and a second surface located opposite to each other, and a plurality of plasmonic nanopatterns provided on the second surface, wherein the substrate includes a high-concentration doping region provided adjacent to the first surface, a substrate region provided between the high-concentration doping region and the plurality of plasmonic nanopatterns, and a first well provided between the substrate region and the high-concentration doping region, wherein the first well has a first conductivity type, and the high-concentration doping region has a second conductivity type different from the first conductivity type.

According to another aspect of the disclosure, a light detection and ranging (LiDAR) device includes an electronic device, wherein the electronic device includes a single-photon detection element, and the single-photon detection element includes a substrate including a first surface and a second surface located opposite to each other, and a plurality of plasmonic nanopatterns provided on the second surface, wherein the substrate includes a high-concentration doping region provided adjacent to the first surface, a substrate region provided between the high-concentration doping region and the plurality of plasmonic nanopatterns, and a first well provided between the substrate region and the high-concentration doping region, wherein the first well has a first conductivity type, and the high-concentration doping region has a second conductivity type different from the first conductivity type.

BRIEF DESCRIPTION OF THE DRAWINGS

The above and other aspects, features, and advantages of certain embodiments will be more apparent from the following description taken in conjunction with the accompanying drawings, in which.

DETAILED DESCRIPTION

Figure 1:
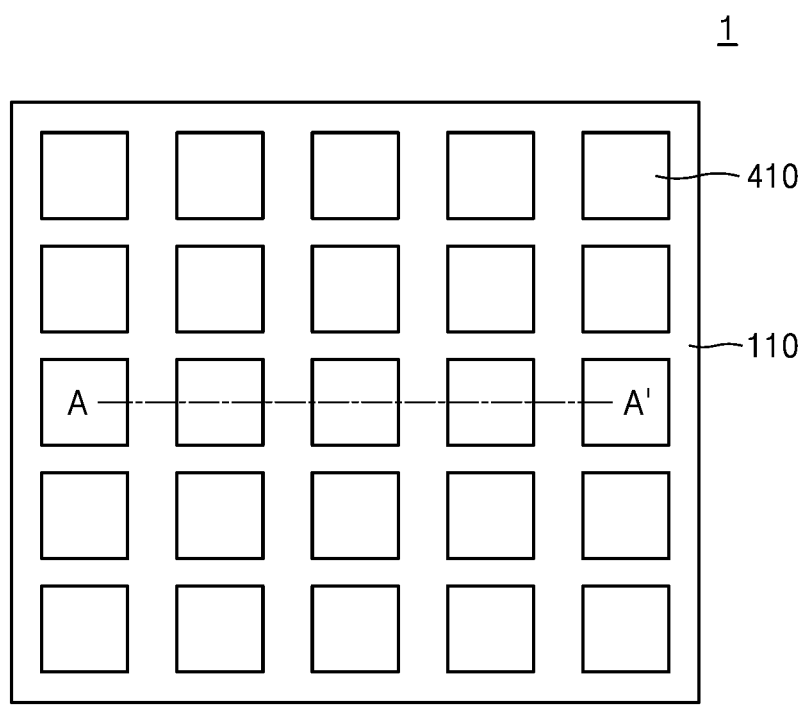
FIG. 1 is a plan view illustrating a single-photon detection element, according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments will be described with reference to the drawings. Like reference numerals denote like elements throughout, and in the drawings, sizes of elements may be exaggerated for clarity and convenience of explanation. Also, the embodiments described below are merely examples, and various modifications may be made from the embodiments.

When an element is referred to as being "on" another element, it may be directly on the other element, or intervening elements may be present therebetween.

The singular forms "a," "an," and "the" are intended to include the plural forms as well, unless the context clearly indicates otherwise. When a portion "includes" an element, another element may be further included, rather than excluding the existence of the other element, unless otherwise described.

Also, the term such as " . . . unit" used therein refers to a unit for processing at least one function or operation.

Throughout the disclosure, the expression "at least one of a, b, and c" indicates only a, only b, only c, both a and b, both a and c, both b and c, or all of a, b, and c.

Figure 2:
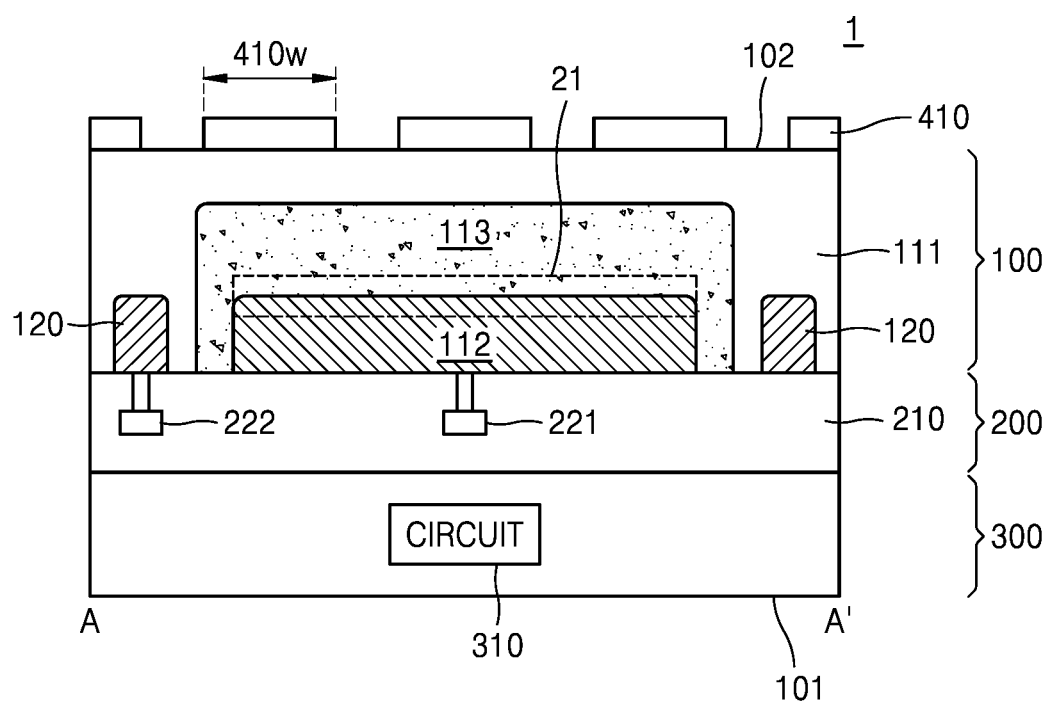
FIG. 2 is a cross-sectional view taken along line A-A' of the single-photon detection element of FIG. 1.

FIG. 1 is a plan view illustrating a single-photon detection element, according to an embodiment. FIG. 2 is a cross-sectional view taken along line A-A' of the single-photon detection element of FIG. 1.

Referring to FIG. 1, a single-photon detection element 1 may be provided. The single-photon detection element 1 may include a single-photon avalanche diode (SPAD). In an example, the SPAD may be referred to as a Geiger-mode avalanche photodiode (APD) (G-APD).

The single-photon detection element 1 may include a substrate 100, a connection layer 200, a control layer 300, and plasmonic nanopatterns 410. The substrate 100 may include a semiconductor. For example, the substrate 100 may be a silicon (Si) substrate. For example, the substrate may be an epitaxy layer formed by using an epitaxy growth process. The substrate 100 may have a first surface 101 and a second surface 102 located opposite to each other. For example, the first surface 101 and the second surface 102 may be flat surfaces.

The substrate 100 may include a substrate region 111, a high-concentration doping region 112, a first well 113, and a contact region 120. The substrate region 111, the high-concentration doping region 112, the first well 113, and the contact region 120 may have different conductivity type or/and concentrations from the substrate 100. The substrate region 111 may refer to a portion other than the high-concentration doping region 112, the first well 113, and the contact region 120 in the substrate 100. The substrate region 111 may have a first conductivity type. For example, a conductivity type of the substrate region 111 may be n-type or p-type. When a conductivity type of the substrate region 111 is n-type, the substrate region 111 may include a group 5 element (e.g., phosphorus (P), arsenic (As), or antimony (Sb)), a group 6 element, or a group 7 element as impurities. When a conductivity type of the substrate region 111 is p-type, the substrate region 111 may include a group 3 element (e.g., boron (B), aluminum (Al), gallium (Ga), or indium (In)) or a group 2 element as impurities. A region whose conductivity type is n-type may be formed by implanting a group 5 element (e.g., phosphorus (P), arsenic (As), or antimony (Sb)), a group 6 element, or a group 7 element as impurities into the substrate 100, and a region whose conductivity type is p-type may be formed by implanting a group 3 element (e.g., boron (B), aluminum (Al), gallium (Ga), or indium (In)) or a group 2 element as impurities into the substrate 100. In an embodiment, impurities may be provided in-situ in an epitaxy growth process of forming the substrate 100. For example, a doping concentration of the substrate region 111 may range from about $1 \times 10^{14}$ to about $1 \times 10^{19}$ cm$^{-3}$.

The high-concentration doping region 112 may be formed from the first surface 101 to a certain depth. The high-concentration doping region 112 may have a second conductivity type different from the first conductivity type. When the first conductivity type is n-type, a conductivity type of the high-concentration doping region 112 may be p-type. When the first conductivity type is p-type, a conductivity type of the high-concentration doping region 112 may be n-type. A doping concentration of the high-concentration doping region 112 may range from about $1 \times 10^{15}$ to about $1 \times 10^{22}$ cm$^{-3}$.

The first well 113 may be provided between the high-concentration doping region 112 and the substrate region 111. The high-concentration doping region 112 and the substrate region 111 may be spaced apart from each other by the first well 113. The first well 113 may cover a surface of the high-concentration doping region 112 facing the substrate region 111. The first well 113 may occupy another portion of the first surface 101. On the first surface 101, the first well 113 may surround the high-concentration doping region 112. When the first surface 101 is viewed, the first well 113 may have a ring shape and the high-concentration doping region 112 may be provided in an inner edge of the first well 113. The first well 113 may have the first conductivity type. A doping concentration of the first well 113 may be higher than a doping concentration of the substrate region 111, and may be lower than a doping concentration of the high-concentration doping region 112. For example, a doping concentration of the first well 113 may range from about $1 \times 10^{14}$ to about $1 \times 10^{19}$ cm$^{-3}$.

A main depletion region 21 may be formed in a portion adjacent to an interface between the first well 113 and the high-concentration doping region 112. When a reverse bias is applied to the single-photon detection element 1, a strong electric field may be applied to the main depletion region 21. For example, when the single-photon detection element 1 operates as a SPAD, a maximum intensity of an electric field may range from about $1 \times 10^5$ to about $1 \times 10^6$ V/cm. Because electrons may be multiplied by an electric field of the main depletion region 21, the main depletion region 21 may be referred to as a multiplication region.

The contact region 120 may be provided in the substrate region 111. The contact region 120 may be electrically connected to a circuit outside the single-photon detection element 1. For example, a voltage may be applied to the substrate region 111 from the circuit outside the single-photon detection element 1 through the contact region 120. The contact region 120 may be provided on a side surface of the first well 113. The contact region 120 may surround the first well 113. For example, when the first surface 101 is viewed, the contact region 120 may have a ring shape extending along the side surface of the first well 113. The contact region 120 may be spaced apart from the first well 113. The substrate region 111 may extend to a portion between the contact region 120 and the first well 113. For example, the portion between the contact region 120 and the first well 113 may be filled with the substrate region 111. The contact region 120 may have the first conductivity type. A doping concentration of the contact region 120 may be higher than a doping concentration of the substrate region 111. For example, a doping concentration of the contact region 120 may range from about $1\times10^{15}$ to about $1\times10^{22}$ $cm^{-3}$.

The connection layer 200 may be provided on the first surface 101 of the substrate 100. The connection layer 200 may include an insulating layer 210, a first conductive line 221, and a second conductive line 222. For example, the insulating layer 210 may include silicon oxide (e.g., $SiO_2$), silicon nitride (e.g., SiN), silicon oxynitride (e.g., SiON), or a combination thereof.

The first conductive line 221 and the second conductive line 222 may be respectively electrically connected to the high-concentration doping region 112 and the contact region 120. The first and second conductive lines 221 and 222 may include an electrically conductive material. For example, the first and second conductive lines 221 and 222 may include copper (Cu). The first and second conductive lines 221 and 222 may include a plurality of portions extending in a direction intersecting the first surface 101 or a direction horizontal to the first surface 101. The first and second conductive lines 221 and 222 may electrically connect the high-concentration doping region 112 and the contact region 120 to a circuit 310 of the control layer 300. One of the first conductive line 221 and the second conductive line 222 may apply a bias to the single-photon detection element 1, and the other may extract a detection signal. For example, the first conductive line 221 may extract an electrical signal from the high-concentration doping region 112, and the second conductive line 222 may apply a bias voltage to the contact region 120. In another example, the second conductive line 222 may extract an electrical signal from the contact region 120, and the first conductive line 221 may apply a bias voltage to the high-concentration doping region 112.

The control layer 300 may be provided opposite to the substrate 100 with the connection layer 200 therebetween. The control layer 300 may include the circuit 310. For example, the control layer 300 may be a chip in which the circuit 310 is formed. The circuit 310 may be electrically connected to the first conductive line 221 and the second conductive line 222. The circuit 310 may include various electronic elements when necessary. When the single-photon detection element 1 includes a SPAD, the circuit 310 may include a quenching resistor (or a quenching circuit) and pixel circuits. The quenching resistor (or the quenching circuit) may stop an avalanche effect, and may enable the SPAD to detect another photon. The pixel circuits may include a reset or recharge circuit, a memory, an amplification circuit, a counter, a gate circuit, and a time-to-digital converter. Also, the circuit 310 may include a direct current (DC)-to-DC converter and a power management integrated circuit. The circuit 310 may transmit a signal to the single-photon detection element 1, or may receive a signal from the single-photon detection element 1. Although the circuit 310 is provided in the control layer 300, this is merely an example. In another example, the circuit 310 may be located on the substrate 100.

The plasmonic nanopatterns 410 may be provided on the second surface 102 of the substrate 100. As shown in FIG. 1, the plasmonic nanopatterns 410 may be arranged in a lattice shape in a direction parallel to the second surface 102. However, an arrangement shape of the plasmonic nanopatterns 410 is not limited thereto, and may be determined as necessary. The nanopatterns 410 may have square cross-sectional shapes. However, the cross-sectional shape of the plasmonic nanopatterns 410 is not limited thereto, and may be determined as necessary. An interval between the plasmonic nanopatterns 410 may range from several nanometers (nm) to several micrometers (μm). Each of the plasmonic nanopatterns 410 may have a width 410w less than a wavelength of light to be detected by the single-photon detection element 1. For example, the width 410w of each of the plasmonic nanopatterns 410 may range from several nanometers (nm) to several micrometers (μm). In an example, the plasmonic nanopatterns 410 may be an ultrathin metal film. A thickness of each of the plasmonic nanopatterns 410 may be determined as necessary. For example, as a thickness of each of the plasmonic nanopatterns 410 decreases, the efficiencies for hot carriers of the plasmonic nanopatterns 410 to be injected into the substrate 100 may be improved. However, as a thickness of each of the plasmonic nanopatterns 410 decreases, the absorbance and plasmonic properties of the plasmonic nanopatterns 410 may be affected and the quality (e.g., purity, crystallinity, grain size, and surface roughness) of the plasmonic nanopatterns 410 may be degraded. Accordingly, a thickness of each of the plasmonic nanopatterns 410 may be determined in consideration of various requirements. For example, a thickness of each of the plasmonic nanopatterns 410 may range from several nanometers (nm) to several micrometers (μm). The plasmonic nanopatterns 410 may include a material having a high free charge density to excite plasmon. For example, the plasmonic nanopatterns 410 may include a metal (e.g., gold (Au), copper (Cu), aluminum (Al), or TiN) or a material having a free electron density similar to that of a metal. In an example, the plasmonic nanopatterns 410 may be formed by using atomic layer deposition (ALD).

The substrate 100 may not absorb light with energy less than a bandgap of a semiconductor material of the substrate 100. For example, because bandgap energy of silicon is 1.12 eV, the single-photon detection element formed on the substrate 100 may detect near-infrared (NIR) rays, but may not detect infrared rays having a longer wavelength (e.g., a wavelength of 1300 nanometers (nm) or more) (e.g., short-wavelength infrared (SWIR), mid-wavelength infrared (NWIR), and long-wavelength infrared (LWIR)).

The plasmonic nanopatterns 410 may form a Schottky junction with the substrate 100. Accordingly, a Schottky barrier may be formed between the plasmonic nanopatterns 410 and the substrate 100. A height of the Schottky barrier is less than a bandgap of the substrate 100. When light is incident on the plasmonic nanopatterns 410, electrons or holes in the plasmonic nanopatterns 410 may be excited. Carriers with energy higher than the Schottky barrier among the excited carriers may be hot electrons or hot holes. The hot electrons or the hot holes may travel across the Schottky barrier to the substrate 100. As the hot electrons or the hot holes travel or are injected into the substrate 100, photocurrent may be formed in the substrate 100. In an example, a portion adjacent to the second surface 102 of the substrate 100 may be additionally doped, in order to adjust injection characteristics (i.e., charge injection characteristics) of the hot electrons or the hot holes excited in the plasmonic nanopatterns 410.

In order to increase the number of hot electrons or hot holes, the plasmonic nanopatterns 410 are required to have high optical absorption. According to the disclosure, an absorption may be increased by generating plasmons on surfaces of the plasmonic nanoparticles 410. For example, when short-wavelength infrared rays are incident on the plasmonic nanopatterns 410, plasmons that are collective oscillation of carriers (electrons or holes) may be generated on the surfaces of the plasmonic nanopatterns 410 contacting the substrate 100. Some of the oscillating carriers may be hot carriers (hot electrons or hot holes) with energy greater than the Schottky barrier. The hot carriers may travel across the Schottky barrier to the substrate 100. Because the plasmonic nanopatterns 410 contact the second surface 102 of the substrate 100, the hot carriers may move from the plasmonic nanopatterns 410 to the second surface 102 of the substrate 100. The hot carriers injected into the substrate 100 across the Schottky barrier may move to the high-concentration doping region 112 due to an electric field applied in the substrate 100. The hot carriers injected into the substrate 100 across the Schottky barrier may generate a large amount of carriers in the main depletion region 21 (i.e., multiplication region). The circuit 310 may measure the large amount of carriers. In the above process, the short-wavelength infrared rays may be detected.

Although the single-photon detection element 1 detects the short-wavelength infrared rays in the above, this is merely an example. The single-photon detection element 1 may detect light with energy less than a bandgap of a semiconductor material of the substrate 100. For example, when the plasmonic nanopatterns 410 have geometric parameters (e.g., period, width, and thickness) for absorbing near-infrared rays, mid-wavelength infrared rays, or long-wavelength infrared rays, the single-photon detection element 1 may detect the near-infrared rays, mid-wavelength infrared rays, or long-wavelength infrared rays. Furthermore, although the substrate 100 includes silicon (Si) in the above, this is merely an example. Even when the substrate 100 includes a semiconductor (e.g., group III-V compound semiconductor) other than silicon, the geometric parameters (e.g., period, width, and thickness) of the plasmonic nanopatterns 410 may be adjusted, and thus, the single-photon detection element 1 may detect light with energy less than a bandgap of the semiconductor (e.g., group III-V compound semiconductor) of the substrate 100.

Accordingly, according to the disclosure, the single-photon detection element 1 capable of detecting light with energy less than a bandgap of a semiconductor of the substrate 100 may be provided.

Figure 3:
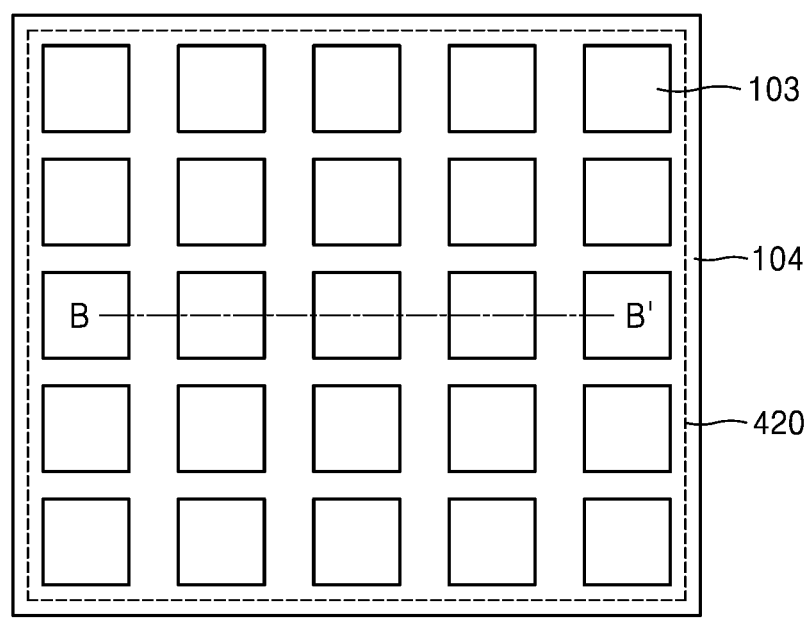
FIG. 3 is a plan view illustrating a single-photon detection element, according to an embodiment.
Figure 4:
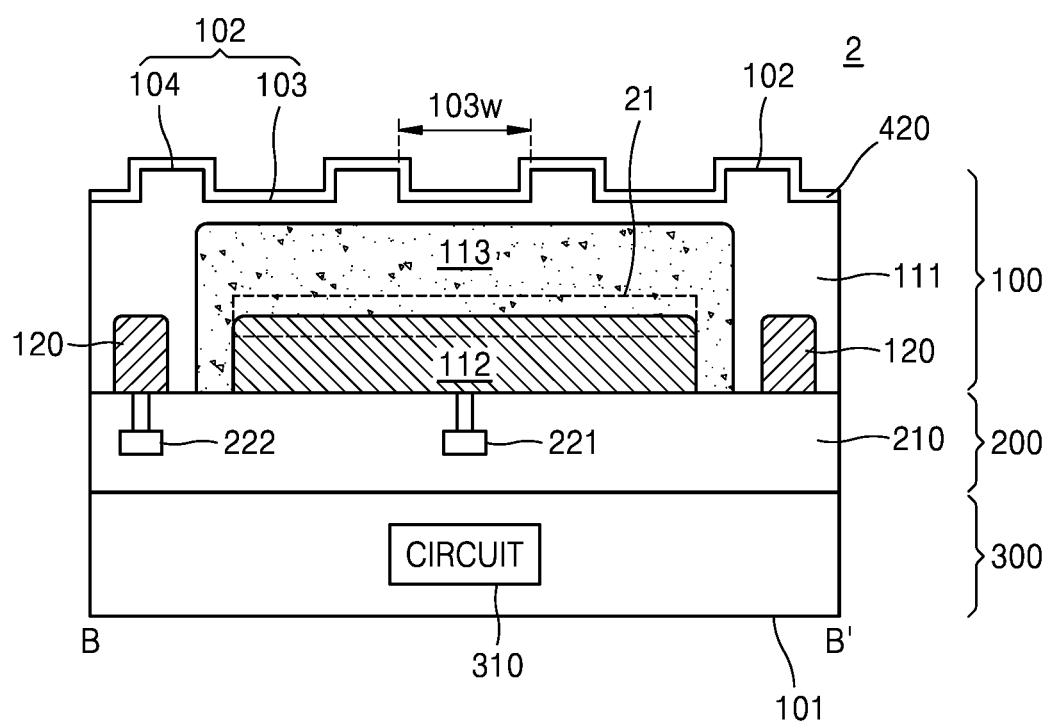
FIG. 4 is a cross-sectional view taken along line B-B' of FIG. 3.

FIG. 3 is a plan view illustrating a single-photon detection element, according to an embodiment. FIG. 4 is a cross-sectional view taken along line B-B' of FIG. 3. For brevity of explanation, the same description as that made with reference to FIGS. 1 and 2 will be omitted.

Referring to FIGS. 3 and 4, a single-photon detection element 2 may be provided. The single-photon detection element 2 may include the substrate 100, the connection layer 200, the control layer 300, and a plasmonic nanolayer 420. The second surface 102 of the substrate 100 may include concave portions 103 and a connection portion 104. The concave portions 103 may be arranged in a direction parallel to the first surface 101. An arrangement shape of the concave portions 103 is not limited thereto, and may be determined as necessary. An interval between the concave portions 103 may range from several nanometers (nm) to several micrometers (μm). Each of the concave portions 103 may have a width 103w less than a wavelength of light to be detected by the single-photon detection element 2. For example, the width 103w of each of the concave portions 103 may range from tens of nanometers (nm) to several micrometers (μm). The connection portion 104 may be provided between the concave portions 103, to connect the concave portions 103.

The plasmonic nanolayer 420 may be provided on the second surface 102. The plasmonic nanolayer 420 may cover the concave portions 103 and the connection portion 104. The plasmonic nanolayer 420 covering the concave portions 103 may be referred to concave films, and the plasmonic nanolayer 420 covering the connection portion 104 may be referred to as a connection film. The plasmonic nanolayer 420 may extend along the second surface 102. For example, the concave films and the connection film may respectively conformably cover the concave portions 103 and the connection portion. In an example, the plasmonic nanolayer 420 may be an ultrathin metal film. In an example, the plasmonic nanolayer 420 may be formed by using ALD. FIG. 4 shows that the plasmonic nanolayer 420 is disposed on both the bottom surfaces of the concave portions 103 and the sidewalls of the concave portions 103. However, it is not limited thereto. The plasmonic nanolayer 420 may be disposed on the bottom surfaces of the concave portions 103 and may not be disposed on the sidewalls of the concave portions 103.

The plasmonic nanolayer 420 may include a material having a high free charge density to excite plasmon. For example, the plasmonic nanolayer 420 may include a metal (e.g., Au, Cu, Al, or TiN) or a material having a free electron density similar to that of a metal. When short-wavelength infrared rays are incident on the plasmonic nanolayer 420, as described with reference to FIGS. 1 and 2, plasmon that is collective oscillation of electrons may be generated on surfaces of the plasmonic nanolayer 420 contacting the concave portions 103, and hot carriers (e.g., hot electrons or hot holes) may travel or be injected into the substrate 100 across a Schottky barrier between the plasmonic nanolayer 420 and the substrate 100 (i.e., Si substrate) and may be detected. Accordingly, the short-wavelength infrared rays may be detected.

Although the single-photon detection element 2 detects the short-wavelength infrared rays in the above, this is merely an example. In another example, when the plasmonic nanolayer 420 has a size enough to absorb near-infrared rays, mid-wavelength infrared rays, or long-wavelength infrared rays, the single-photon detection element 21 may detect the near-infrared rays, mid-wavelength infrared rays, or long-wavelength infrared rays. That is, according to the disclosure, the single-photon detection element 2 capable of detecting light with energy less than a bandgap of a semiconductor of the substrate 100 may be provided.

Figure 5:
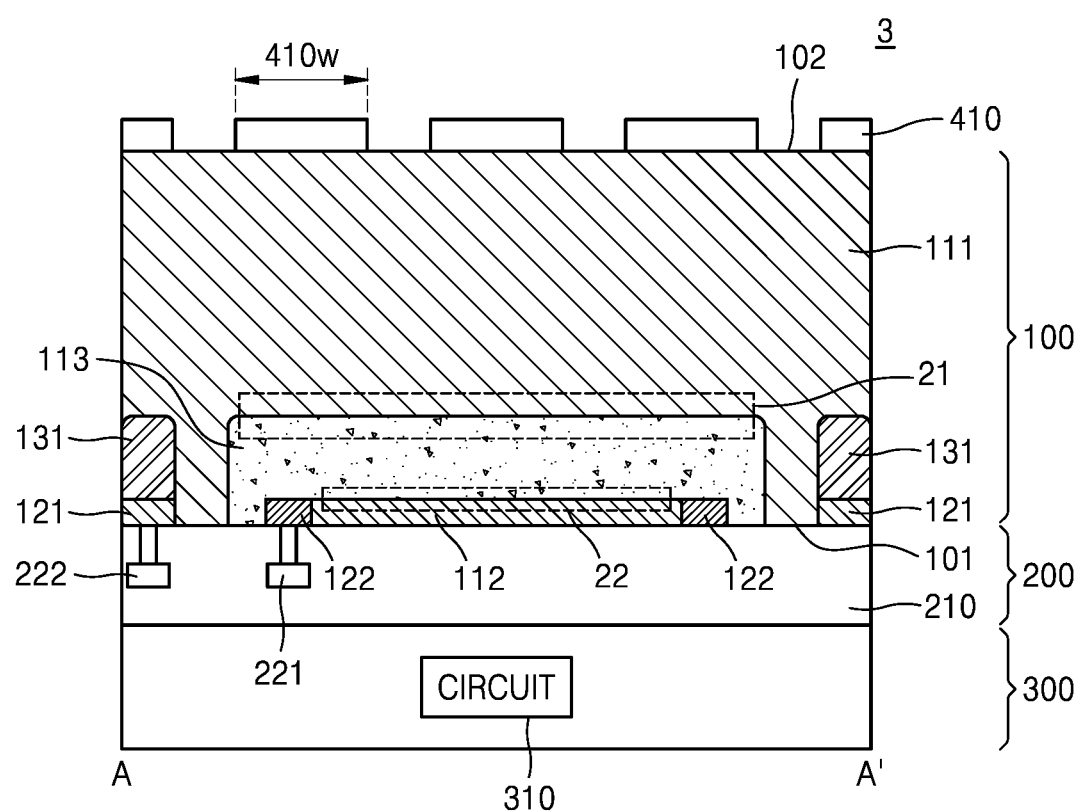
FIG. 5 is a cross-sectional view taken along line A-A' of FIG. 1 of a signal photon detection element, according to an embodiment.

FIG. 5 is a cross-sectional view taken along line A-A' of FIG. 1 of a single-photon detection element, according to an embodiment. For brevity of explanation, the same description as that made with reference to FIGS. 1 and 2 and FIGS. 3 and 4 will be omitted.

Referring to FIG. 5, a single-photon detection element 3 may be provided. The single-photon detection element 3 may include the substrate 100, the connection layer 200, the control layer 300, and the plasmonic nanopatterns 410. The connection layer 200, the control layer 300, and the plasmonic nanopatterns 410 may be substantially the same as those described with reference to FIGS. 1 and 2.

The substrate 100 may include the substrate region 111, the first well 113, a first contact region 121, a first relaxation region 131, the high-concentration doping region 112, and a second contact region 122. The substrate region 111, the first well 113, the first contact region 121, the first relaxation region 131, the high-concentration doping region 112, and the second contact region 122 may be regions having different conductivity types or different doping concentrations in the substrate 100. The substrate region 111 may refer to a portion other than the first well 113, the first contact region 121, the first relaxation region 131, the high-concentration doping region 112, and the second contact region 122. In an example, the first well 113, the first contact region 121, the first relaxation region 131, the high-concentration doping region 112, and the second contact region 122 may be formed by implanting impurities into the substrate 100. The substrate region 111 may be substantially the same as the substrate region 111 of FIGS. 1 and 2.

The third well 113 may have the second conductivity type, unlike in FIGS. 1 and 2. A doping concentration of the first well 113 may be lower than a doping concentration of the second contact region 122 described below. For example, a doping concentration of the first well 113 may range from about $1\times10^{14}$ to about $1\times10^{19}$ cm$^{-3}$. The main depletion region 21 may be generated at an interface between the first well 113 and the substrate region 111.

The high-concentration doping region 112 may have the first conductivity type, unlike in FIGS. 1 and 2. A doping concentration of the high-concentration doping region 112 may be higher than a doping concentration of the substrate region 111. For example, a doping concentration of the high-concentration doping region 112 may range from about $1\times10^{15}$ to about $1\times10^{22}$ cm$^{-3}$.

The first contact region 121 may be provided in the substrate region 111. The first contact region 121 may be electrically connected to a circuit outside the single-photon detection element 3. For example, a voltage may be applied to the substrate region 111 from the circuit outside the single-photon detection element 3 through the first contact region 121. The first contact region 121 may be provided on a side surface of the first well 113. The first contact region 121 may surround the first well 113. For example, the first contact region 121 may have a ring shape extending along the side wall of the first well 113. The first contact region 121 may be spaced apart from the first well 113. The substrate region 111 may extend to a portion between the first contact region 121 and the first well 113. For example, the portion between the first contact region 121 and the first well 113 may be filled with the substrate region 111. The first contact region 121 may have the first conductivity type. A doping concentration of the first contact region 121 may be higher than a doping concentration of the substrate region 111. For example, a doping concentration of the first contact region 121 may range from about $1\times10^{15}$ to about $1\times10^{22}$ cm$^{-3}$.

The first relaxation region 131 may be provided between the first contact region 121 and the substrate region 111. The first relaxation region 131 may be electrically connected to the first contact region 121 and the substrate region 111. The first relaxation region 131 may reduce a difference between the first contact region 121 and the substrate region 111. The first relaxation region 131 may be provided on a side surface of the first well 113. The first relaxation region 131 may surround the first well 113. For example, the first relaxation region 131 may have a ring shape extending in an extending direction of the side surface of the first well 113. The first contact region 121 and the first relaxation region 131 may be arranged on the first surface 101 in a direction facing the second surface 102. Although side surfaces of the first relaxation region 131 are coplanar with side surfaces of the first contact region 121, this is merely an example. In another example, the first contact region 121 may extend over the side surfaces of the first relaxation region 131. The first relaxation region 131 may be spaced apart from the first well 113. The substrate region 111 may extend to a portion between the first relaxation region 131 and the first well 113. For example, the portion between the first relaxation region 131 and the first well 113 may be filled with the substrate region 111. In an example, a distance between the first relaxation region 131 and the second surface 102 may be less than a distance between the first well 113 and the second surface 102. The first relaxation region 131 may have the first conductivity type. A doping concentration of the first relaxation region 131 may be lower than a doping concentration of the first contact region 121, and may be higher than a doping concentration of the substrate region 111. For example, a doping concentration of the first relaxation region 131 may range from about $1\times10^{15}$ to about $1\times10^{19}$ cm$^{-3}$.

A sub-depletion region 22 may be formed in a portion adjacent to an interface between the high-concentration doping region 112 and the first well 113. The sub-depletion region 22 may reduce or substantially prevent electrons or holes other than electron-hole pairs generated by photons in the single-photon detection element 3 from being provided to the main depletion region 21. For example, the electrons or holes other than the electron-hole pairs generated by the photons in the single-photon detection element 3 may be generated due to defects of a surface (e.g., the first surface 101) of the single-photon detection element 3 adjacent to the sub-depletion region 22. The sub-depletion region 22 may reduce or substantially prevent the electrons or holes generated due to the surface defects of the single-photon detection element 3 from moving to the main depletion region 21.

The second contact region 122 may be provided on the first well 113. The second contact region 122 may be electrically connected to the circuit 310 of the control layer 300. For example, when the single-photon detection element 3 is a SPAD, the single-photon detection element 3 may be electrically connected to a quenching resistor (or a quenching circuit) and other pixel circuits through the second contact region 122. The second contact region 122 may be provided on a side surface of the high-concentration doping region 112. The second contact region 122 may be provided between the high-concentration doping region 112 and the first well 113. For example, the second contact region 122 may have a ring shape extending along the side surface of the high-concentration doping region 112 on the first surface 101. The second contact region 122 may contact the high-concentration doping region 112 and the first well 113. The second contact region 122 may have the second conductivity type. A doping concentration of the second contact region 122 may be higher than a doping concentration of the first well 113. For example, a doping concentration of the second contact region 122 may range from about $1\times10^{15}$ to about $1\times10^{22}$ cm$^{-3}$.

Electrons or holes generated due to surface defects of the single-photon detection element 3 may be multiplied in the main depletion region 21 and may cause a noise signal. The sub-depletion region 22 of the disclosure may reduce or substantially prevent the electrons or holes generated due to the surface defects on the first surface 101 of the single-photon detection element 3 from moving to the main depletion region 21. Accordingly, the single-photon detection element 3 having low noise may be provided.

In another example, the single-photon detection element 3 may include the second surface 102 including the concave portions 103 and the connection portion 104 and the plasmonic nanolayer 420, as shown in FIG. 4.

Figure 6:
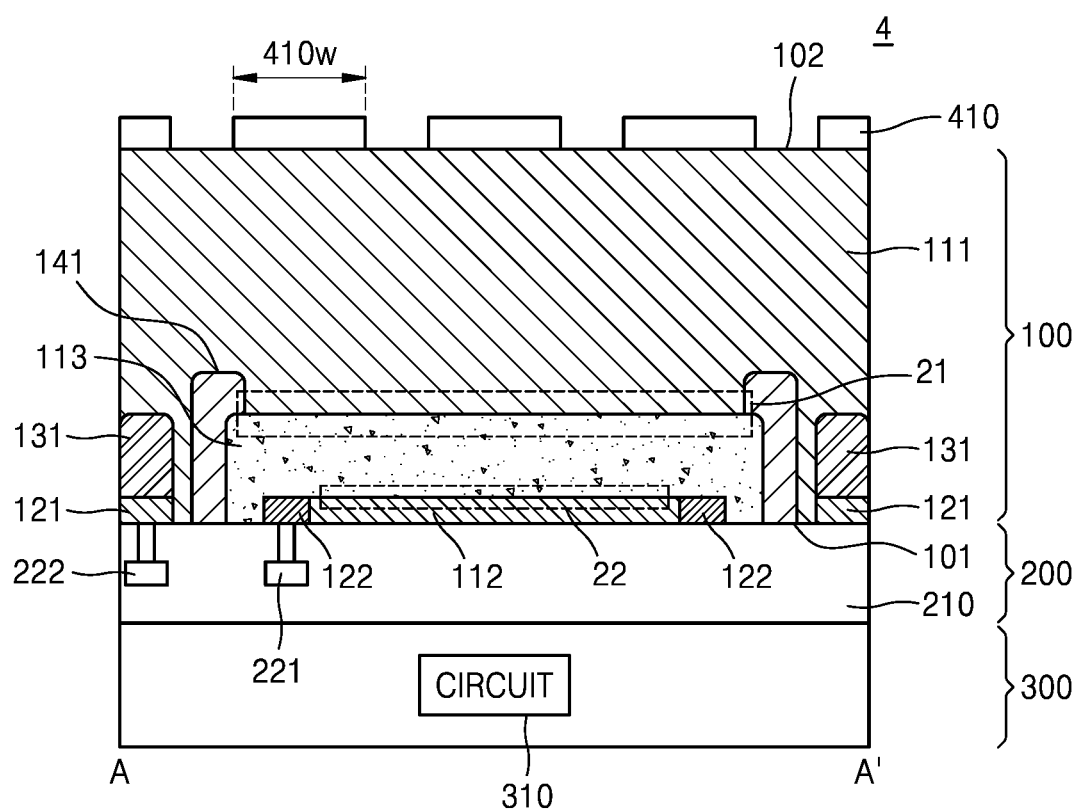
FIG. 6 is a cross-sectional view taken along line A-A' of FIG. 1 of a signal photon detection element, according to an embodiment.

FIG. 6 is a cross-sectional view taken along line A-A' of FIG. 1 of a single-photon detection element, according to an embodiment. For brevity of explanation, the same description as that made with reference to FIG. 5 will be omitted.

Referring to FIG. 6, a single-photon detection element 4 may be provided. The single-photon detection element 4 may include the substrate 100, the connection layer 200, the control layer 300, and the plasmonic nanopatterns 410. Unlike in FIG. 5, the substrate 100 may further include a guard ring 141.

The guard ring 141 may be provided on a side surface of the first well 113. The guard ring 141 may prevent premature breakdown by reducing the concentration of an electric field at an edge of the first well 113. Premature breakdown, which is a phenomenon where breakdown first occurs at an edge of the first well 113 before an electric field of a sufficient magnitude is applied to the main depletion region 21, occurs as an electric field is concentrated at the edge of the first well 113. The guard ring 141 may improve breakdown characteristics of the single-photon detection element 4. On the first surface 101, the guard ring 141 may surround the first well 113. For example, the guard ring 141 may have a ring shape extending along a side surface of the first well 113. The guard ring 141 may be formed to a position closer to the first well 113 than the second surface 102. A distance between the guard ring 141 and the second surface 102 may be less than a distance between the first well 113 and the second surface 102. The guard ring 141 may directly contact the first well 113. The guard ring 141 may be spaced apart from the first contact region 122 and the first relaxation region 131. The substrate region 111 may extend to a portion between the guard ring 141 and the first relaxation region 131 and a portion between the guard ring 141 and the first contact region 122. For example, the portion between the guard ring 141 and the first relaxation region 131 and the portion between the guard ring 141 and the first contact region 122 may be filled with the substrate region 111. The guard ring 141 is not limited to being spaced apart from the first contact region 122 and the first relaxation region 131. In another example, the guard ring 141 may directly contact the first contact region 122 and the first relaxation region 131. The guard ring 141 may have the second conductivity type. A doping concentration of the guard ring 141 may be lower than a doping concentration of the first well 113. For example, a doping concentration of the guard ring 141 may range from about $1 \times 10^{15}$ to about $1 \times 10^{18}$ cm$^{-3}$.

According to the disclosure, the single-photon detection element 4 having low noise and improved breakdown characteristics may be provided.

Figure 7:
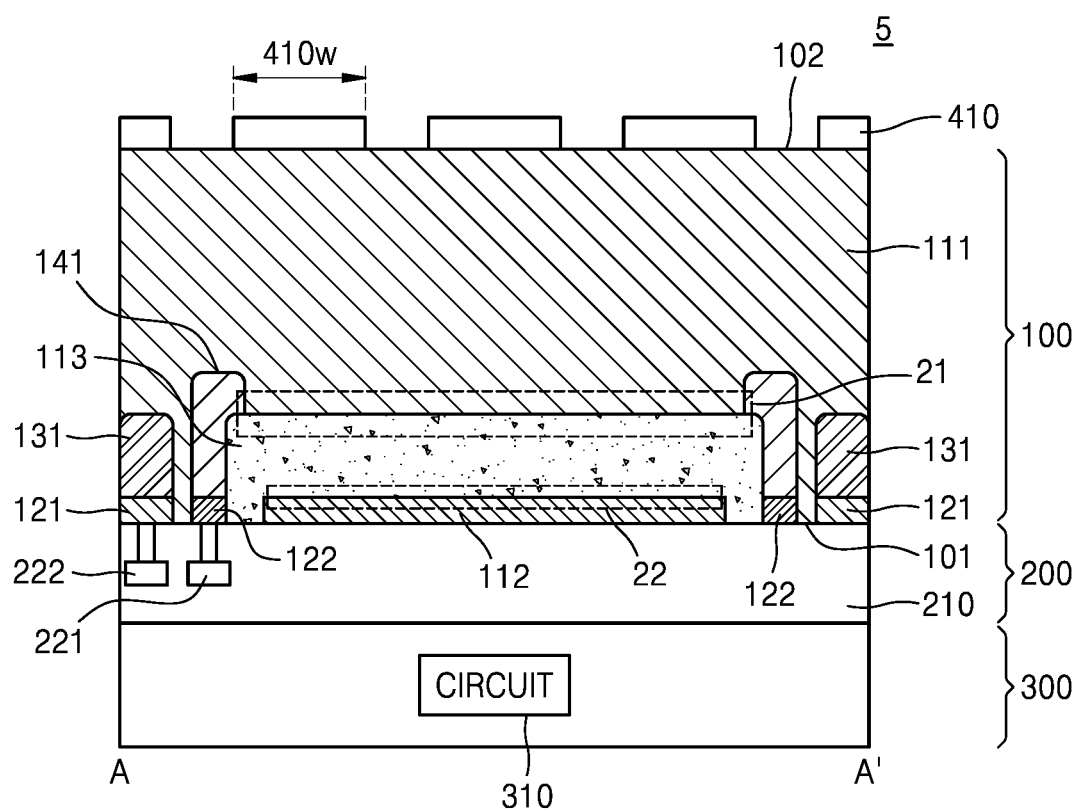
FIG. 7 is a cross-sectional view taken along line A-A' of FIG. 1 of a single-photon detection element, according to an embodiment.

FIG. 7 is a cross-sectional view taken along line A-A' of FIG. 1 of a single-photon detection element, according to an embodiment. For brevity of explanation, the same description as that made with reference to FIG. 6 will be omitted.

Referring to FIG. 7, a single-photon detection element 5 may be provided. The single-photon detection element 5 may include the substrate 100, the connection layer 200, the control layer 300, and the plasmonic nanopatterns 410. Unlike in FIG. 6, the second contact region 122 may be provided between the guard ring 141 and the connection layer 200. On the first surface 101, the second contact region 122 may surround the first well 113. For example, the second contact region 122 may have a ring shape extending along a side surface of the first well 113. Although a side surface of the second contact region 122 is coplanar with a side surface of the guard ring 141 adjacent to the second contact region 122, this is merely an example. In another example, the side surface of the second contact region 122 may be covered by the guard ring 141. The second contact region 122 may be spaced apart from the high-concentration doping region 112. The first well 113 may be provided between the second contact region 122 and the high-concentration doping region 112. In another example, the high-concentration doping region 112 may extend to contact the second contact region 122.

As the second contact region 122 is located on the guard ring 141, the high-concentration doping region 112 may provide a wider area than in FIG. 6. Accordingly, the sub-depletion region 22 may be formed wider than in FIG. 6.

According to the disclosure, the single-photon detection element 5 having low noise and improved breakdown characteristics may be provided.

Figure 8:
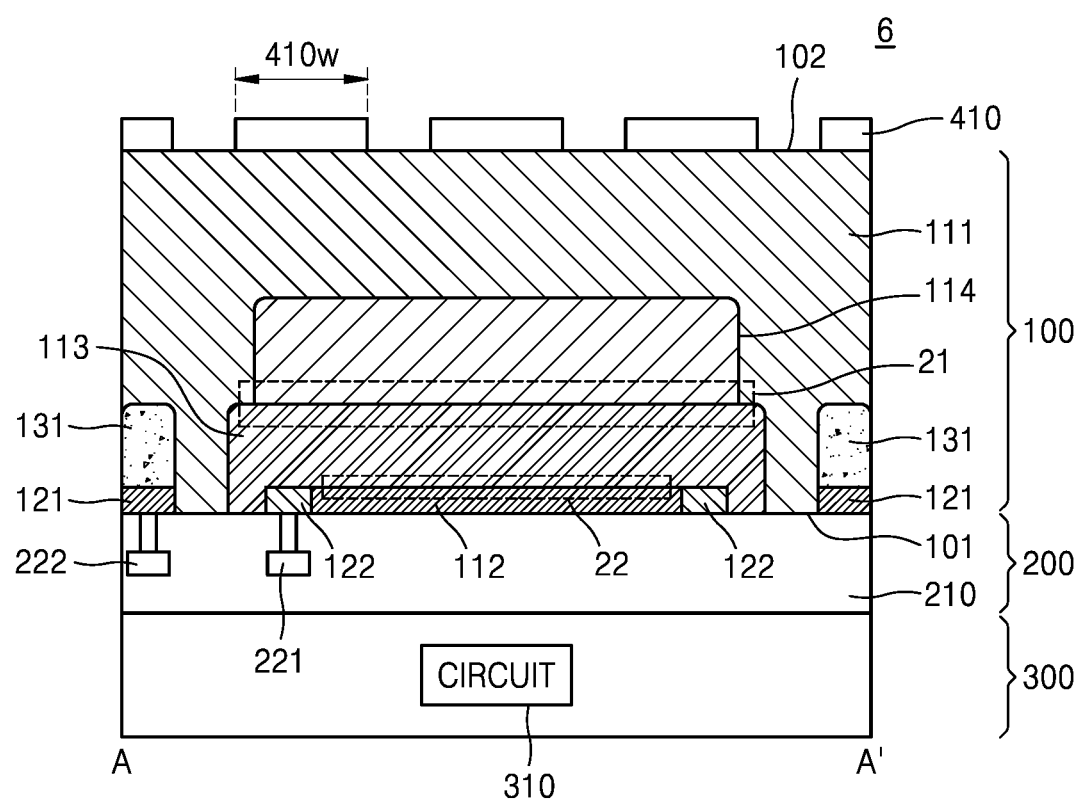
FIG. 8 is a cross-sectional view taken along line A-A' of FIG. 1 of a single-photon detection element, according to an embodiment.

FIG. 8 is a cross-sectional view taken along line A-A' of FIG. 1 of a single-photon detection element, according to an embodiment. For brevity of explanation, the same description as that made with reference to FIG. 5 will be omitted.

Referring to FIG. 8, a single-photon detection element 6 may be provided. The single-photon detection element 6 may include the substrate 100, the connection layer 200, the control layer 300, and the plasmonic nanopatterns 410. Unlike in FIG. 5, the substrate 100 may further include a second well 114. The second well 114 may be provided opposite to the high-concentration doping region 112 with the first well 113 therebetween. The second well 114 may be provided on a surface of the first well 113 facing the second surface 102. The second well 114 may have the first conductivity type. For example, a doping concentration of the second well 114 may range from about $1 \times 10^{14}$ to about $1 \times 10^{18}$ cm$^{-3}$. The main depletion region 21 may be formed in a portion adjacent to an interface between the second well 114 and the first well 113.

Figure 9:
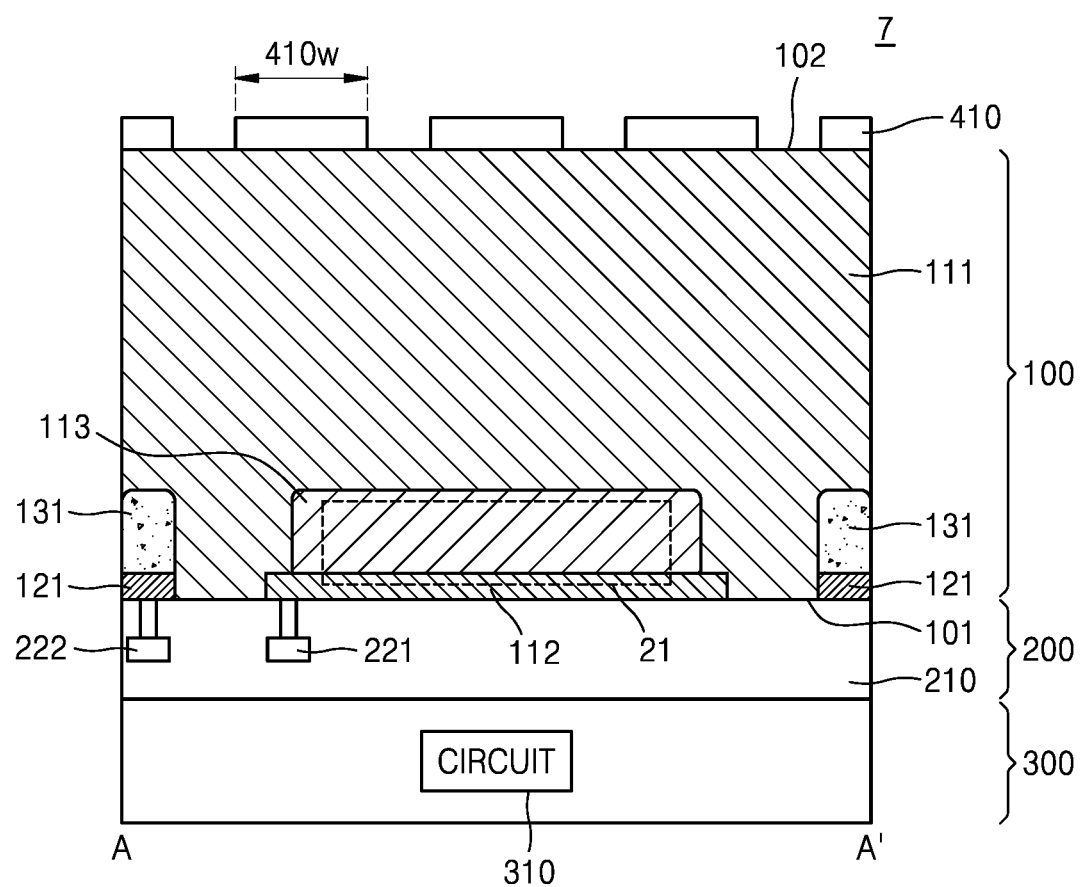
FIG. 9 is a cross-sectional view taken along line A-A' of FIG. 1 of a single-photon detection element, according to an embodiment.

FIG. 9 is a cross-sectional view taken along line A-A' of FIG. 1 of a single-photon detection element, according to an embodiment. For brevity of explanation, the same description as that made with reference to FIG. 5 will be omitted.

Referring to FIG. 9, a single-photon detection element 7 may be provided. The single-photon detection element 7 may include the substrate 100, the connection layer 200, the control layer 300, and the plasmonic nanopatterns 410. Unlike in FIG. 5, the substrate 100 may not include the second contact region 122.

A width of the high-concentration doping region 112 may be greater than a width of the first well 113. Widths of the high-concentration doping region 112 and the first well 113 may be sizes of the high-concentration doping region 112 and the first well 113 in a direction parallel to the first surface 101. The high-concentration doping region 112 may protrude from a side surface of the first well 113. The high-concentration doping region 112 may contact the substrate region 111.

Figure 10:
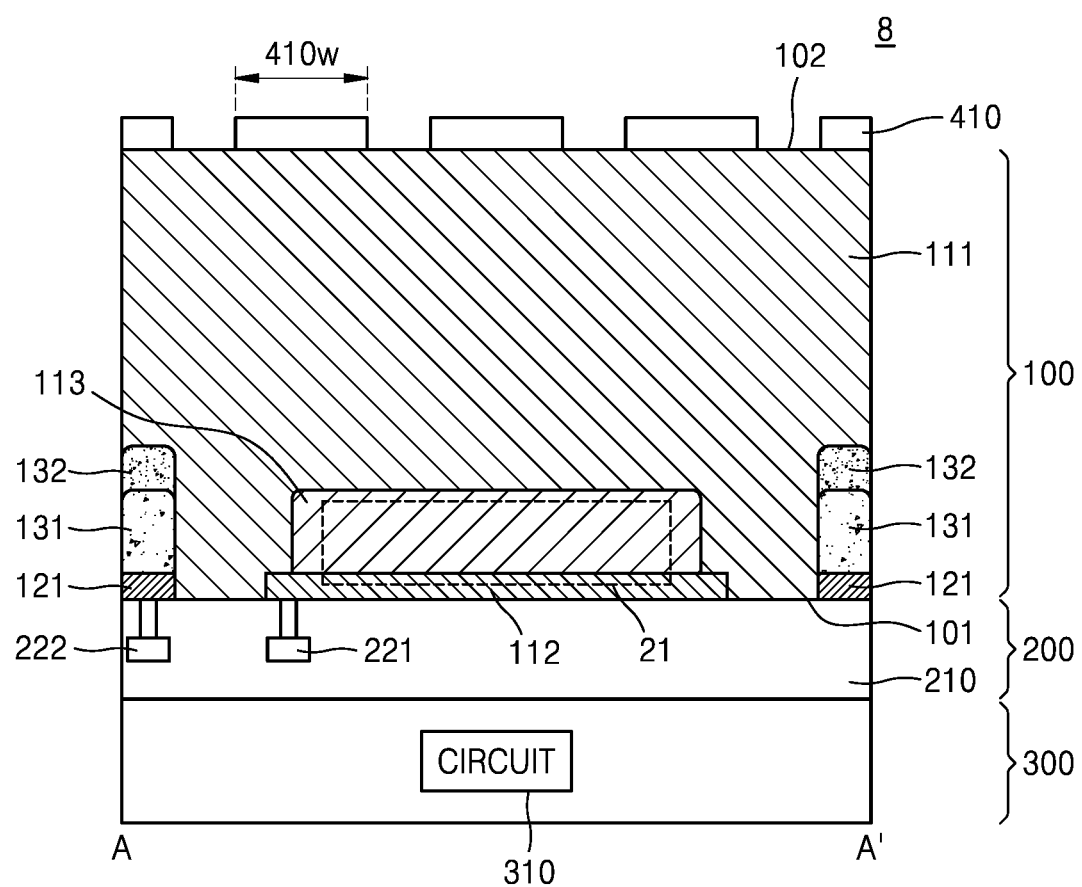
FIG. 10 is a cross-sectional view taken along line A-A' of FIG. 1 of a single-photon detection element, according to an embodiment.

FIG. 10 is a cross-sectional view taken along line A-A' of FIG. 1 of a single-photon detection element, according to an embodiment. For brevity of explanation, the same description as that made with reference to FIG. 9 will be omitted.

Referring to FIG. 10, a single-photon detection element 8 may be provided. The single-photon detection element 8 may include the substrate 100, the connection layer 200, the control layer 300, and the plasmonic nanopatterns 410. Unlike in FIG. 9, the substrate 100 may further include a second relaxation region 132.

The second relaxation region 132 may be provided between the first relaxation region 131 and the substrate region 111. The second relaxation region 132 may be provided opposite to the first contact region 121 with the first relaxation region 131 therebetween. The second relaxation region 132 may be provided on a surface of the first relaxation region 131 facing the second surface 102. The second relaxation region 132 may have the first conductivity type. The second relaxation region 132 may have a doping concentration in a range similar to that of the first relaxation region 131. For example, a doping concentration of the second relaxation region 132 may range from about $1\times10^{15}$ to about $1\times10^{19}$ cm$^{-3}$.

When the first relaxation region 131 and the second relaxation region 132 are used, a uniform bias voltage may be applied to the substrate region 111. When a plurality of single-photon detection elements 8 are located adjacent to one another, crosstalk between adjacent single-photon detection elements 8 may be prevented by the first relaxation region 131 and the second relaxation region 132.

Figure 11:
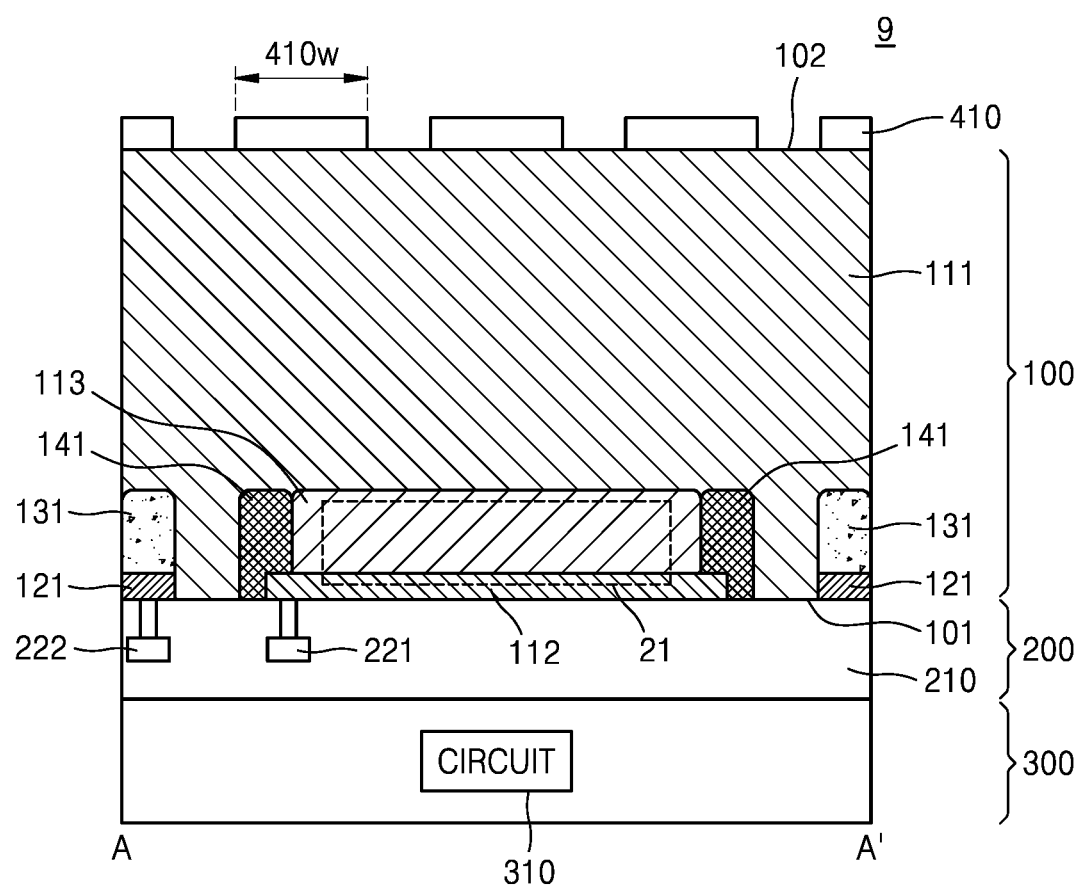
FIG. 11 is a cross-sectional view taken along line A-A' of FIG. 1 of a single-photon detection element, according to an embodiment.

FIG. 11 is a cross-sectional view taken along line A-A' of FIG. 1 of a single-photon detection element, according to an embodiment. For brevity of explanation, the same description as that made with reference to FIG. 9 will be omitted.

Referring to FIG. 11, a single-photon detection element 9 may be provided. The single-photon detection element 9 may include the substrate 100, the connection layer 200, the control layer 300, and the plasmonic nanopatterns 410. Unlike in FIG. 9, the single-photon detection element 9 may further include the guard ring 141.

The guard ring 141 may be provided on a side surface of the first well 113. The guard ring 141 may prevent premature breakdown by reducing the concentration of an electric field at an edge of the high-concentration doping region 112. Premature breakdown, which is a phenomenon where breakdown first occurs at an edge of the high-concentration doping region 112 before an electric field of a sufficient magnitude is applied to the main depletion region 21, occurs as an electric field is concentrated at the edge of the high-concentration doping region 112. The guard ring 141 may improve breakdown characteristics of the single-photon detection element 9. On the first surface 101, the guard ring 141 may surround the first well 113. For example, the guard ring 141 may have a ring shape extending along a side surface of the first well 113. The guard ring 141 may directly contact the first well 113. The guard ring 141 may be spaced apart from the first contact region 121 and the first relaxation region 131. However, this is merely an example. In another example, the guard ring 141 may directly contact the first contact region 121 and the first relaxation region 131. The guard ring 141 may have the second conductivity type. A doping concentration of the guard ring 141 may be lower than a doping concentration of the high-concentration doping region 112. For example, a doping concentration of the guard ring 141 may range from about $1\times10^{15}$ to about $1\times10^{18}$ cm$^{-3}$.

The substrate region 111 may extend to a portion between the guard ring 141 and the first relaxation region 131 and a portion between the guard ring 141 and the first contact region 121. For example, the portion between the guard ring 141 and the first relaxation region 131 and the portion between the guard ring 141 and the first contact region 121 may be filled with the substrate region 111.

Figure 12:
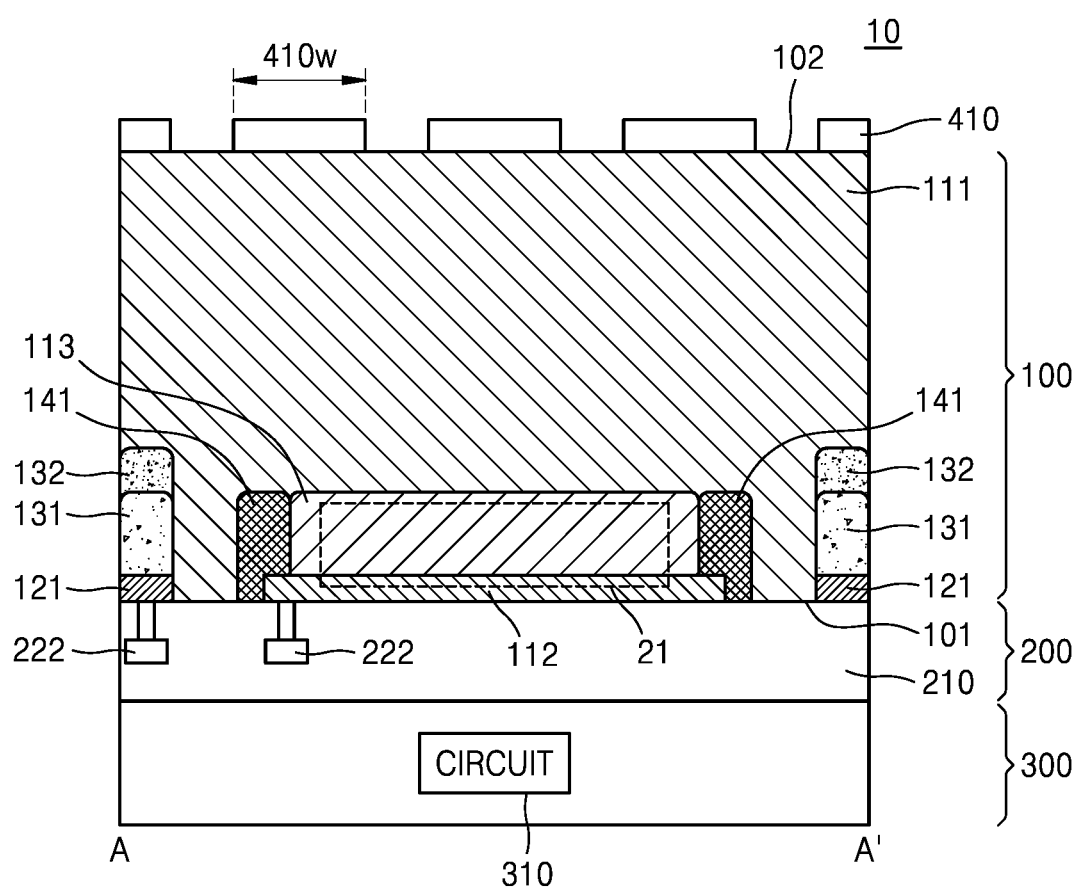
FIG. 12 is a cross-sectional view taken along line A-A' of FIG. 1 of a single-photon detection element, according to an embodiment.

FIG. 12 is a cross-sectional view taken along line A-A' of FIG. 1 of a single-photon detection element, according to an embodiment. For brevity of explanation, the same description as that made with reference to FIG. 10 and FIG. 11 will be omitted.

Referring to FIG. 12, a single-photon detection element 10 may be provided. The single-photon detection element 10 may include the substrate 100, the connection layer 200, the control layer 300, and the plasmonic nanopatterns 410. Unlike in FIG. 10, the single-photon detection element 10 may further include the guard ring 141. The guard ring 141 may be substantially the same as the guard ring 141 of FIG. 11.

Figure 13:
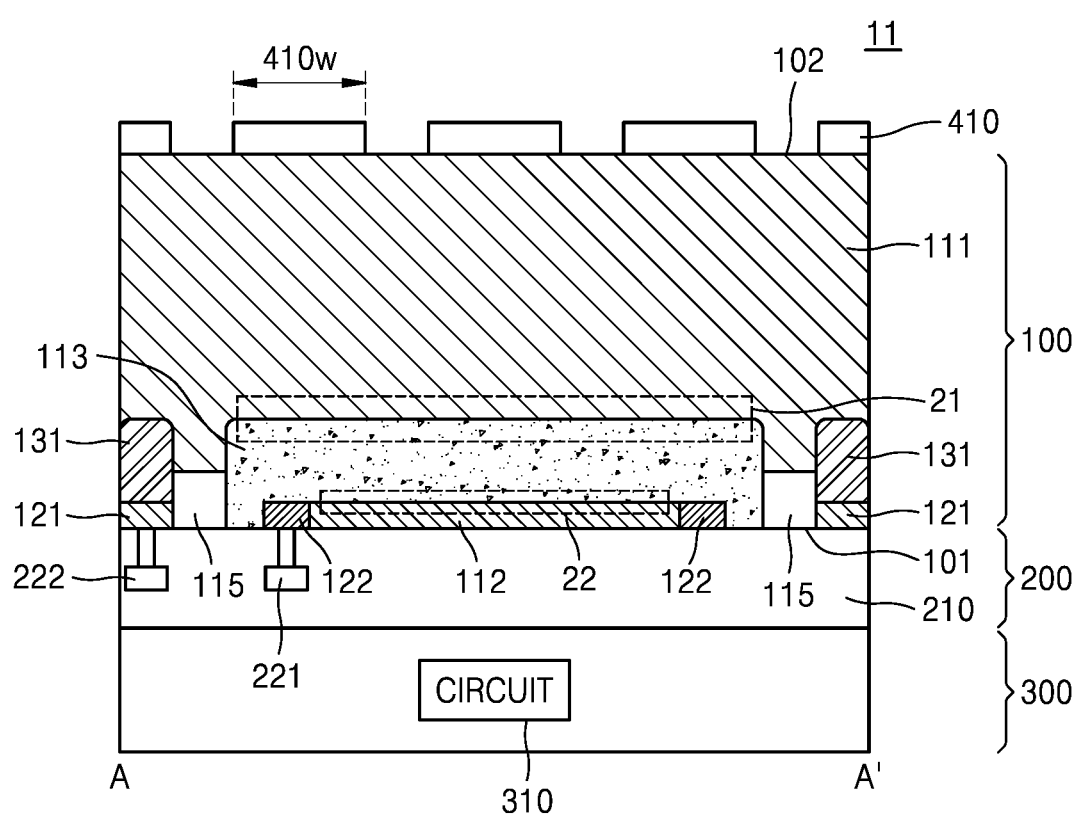
FIG. 13 is a cross-sectional view taken along line A-A' of FIG. 1 of a single-photon detection element, according to an embodiment.

FIG. 13 is a cross-sectional view taken along line A-A' of FIG. 1 of a single-photon detection element, according to an embodiment. For brevity of explanation, the same description as that made with reference to FIG. 5 will be omitted.

Referring to FIG. 13, a single-photon detection element 11 may be provided. The single-photon detection element 11 may include the substrate 100, the connection layer 200, the control layer 300, and the plasmonic nanopatterns 410. Unlike in FIG. 5, a doping concentration of the substrate region 111 may decrease toward the first surface 101.

A first conductivity type region 115 may be provided between the substrate region 111 and the connection layer 200. Although the first conductivity type region 115 is provided between the first relaxation region 131 and the first well 113 and between the first contact region 121 and the first well 113, this is merely an example. The first conductivity type region 115 may have the second conductivity type. The first conductivity type region 115 may have a uniform doping concentration, or may have a doping concentration that increases toward the first surface 101. A doping concentration of the first conductivity type region 115 may be less than a doping concentration of the first well 113.

Figure 14:
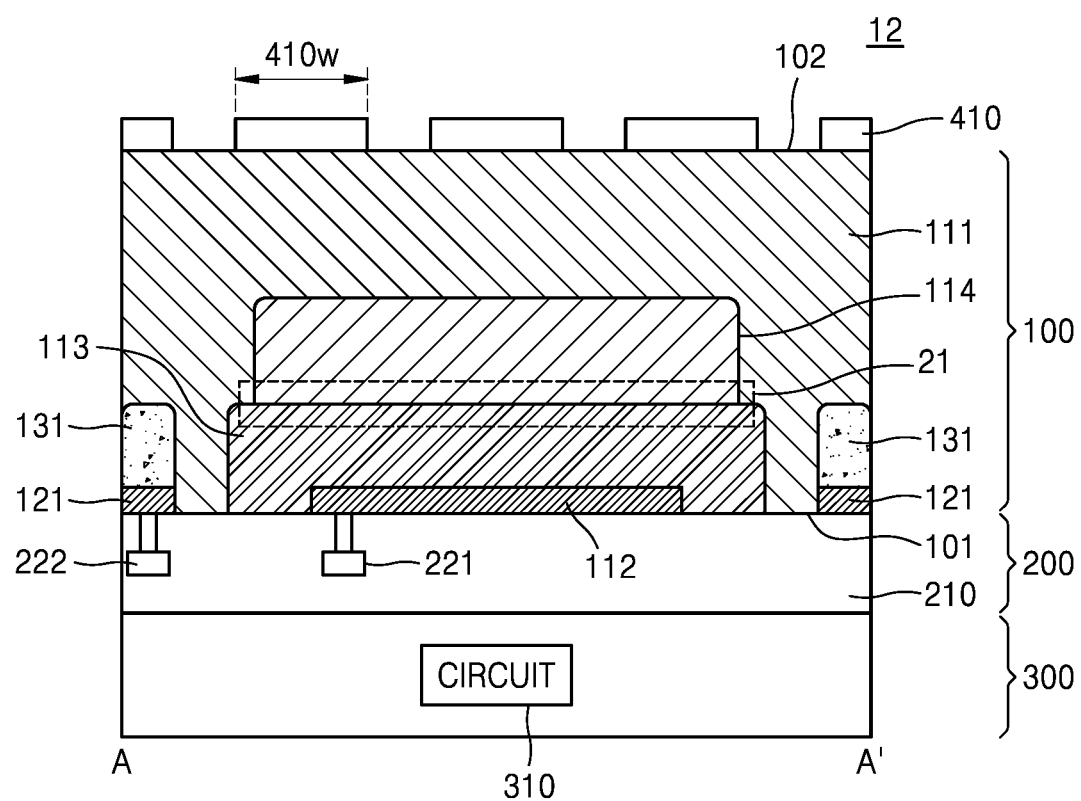
FIG. 14 is a cross-sectional view taken along line A-A' of FIG. 1 of a single-photon detection element, according to an embodiment.

FIG. 14 is a cross-sectional view taken along line A-A' of FIG. 1 of a single-photon detection element, according to an embodiment. For brevity of explanation, the same description as that made with reference to FIG. 8 will be omitted.

Referring to FIG. 14, a single-photon detection element 12 may be provided. The single-photon detection element 12 may include the substrate 100, the connection layer 200, the control layer 300, and the plasmonic nanopatterns 410. Unlike in FIG. 8, the high-concentration doping region 112 may have the same second conductivity type as that of the first well 113. The first conductive line 221 may be electrically connected to the high-concentration doping region 112. The second contact region 122 may not be provided.

Figure 15:
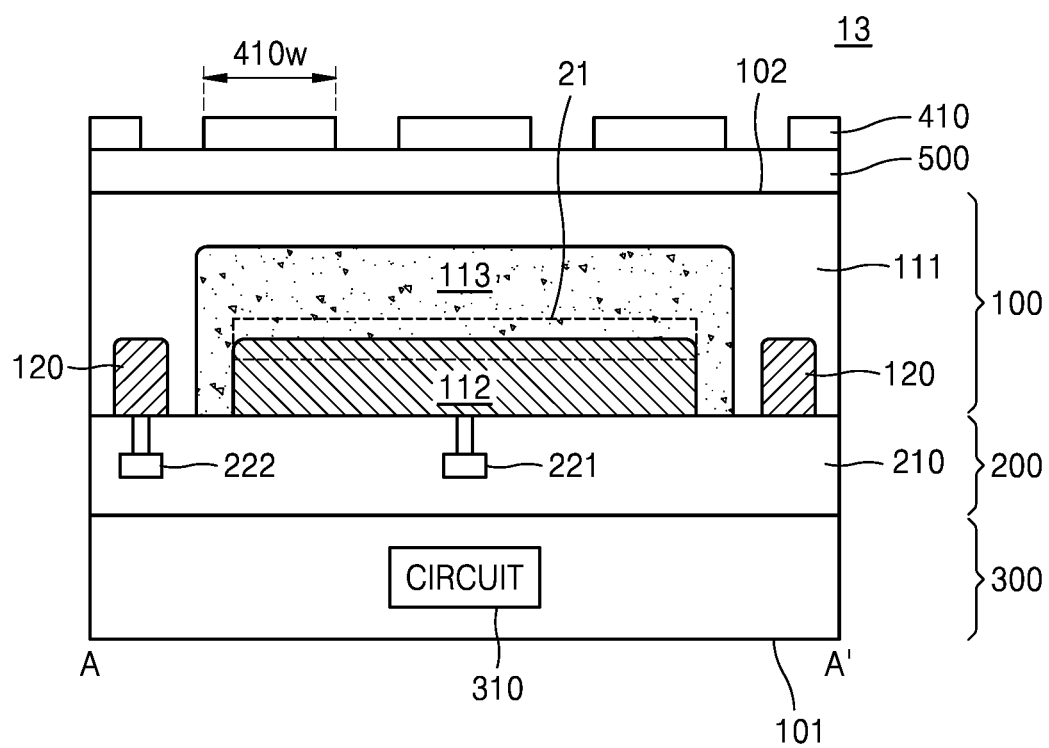
FIG. 15 is a cross-sectional view taken along line A-A' of FIG. 1 of a single-photon detection element, according to an embodiment.

FIG. 15 is a cross-sectional view taken along line A-A' of FIG. 1 of a single-photon detection element, according to an embodiment. For brevity of explanation, the same description as that made with reference to FIGS. 1 and 2 will be omitted.

Referring to FIG. 15, a single-photon detection element 13 may be provided. The single-photon detection element 13 may include the substrate 100, the connection layer 200, the control layer 300, the plasmonic nanopatterns 410, and an intermediate layer 500. The substrate 100, the connection layer 200, the control layer 300, and the plasmonic nanopatterns 410 may be respectively substantially the same as the substrate 100, the connection layer 200, the control layer 300, and the plasmonic nanopatterns 410 of FIGS. 1 and 2.

The intermediate layer 500 may be provided between the substrate 100 and the plasmonic nanopatterns 410. The intermediate layer 500 may improve charge injection characteristics between the plasmonic nanopatterns 410 and the substrate 100. In an example, the intermediate layer 500 may include an insulating layer having a thickness of several nanometers so that photocharges tunnel from the plasmonic nanopatterns 410 to the substrate 100. In an example, the intermediate layer 500 may include a two-dimensional (2D) material film and/or an oxide thin film to improve efficiency in injecting photocharges from the plasmonic nanopatterns 410 into the substrate 100. In an example, the intermediate layer 500 may include a film for improving or modulating light absorption effect in an optical aspect.

Figure 16:
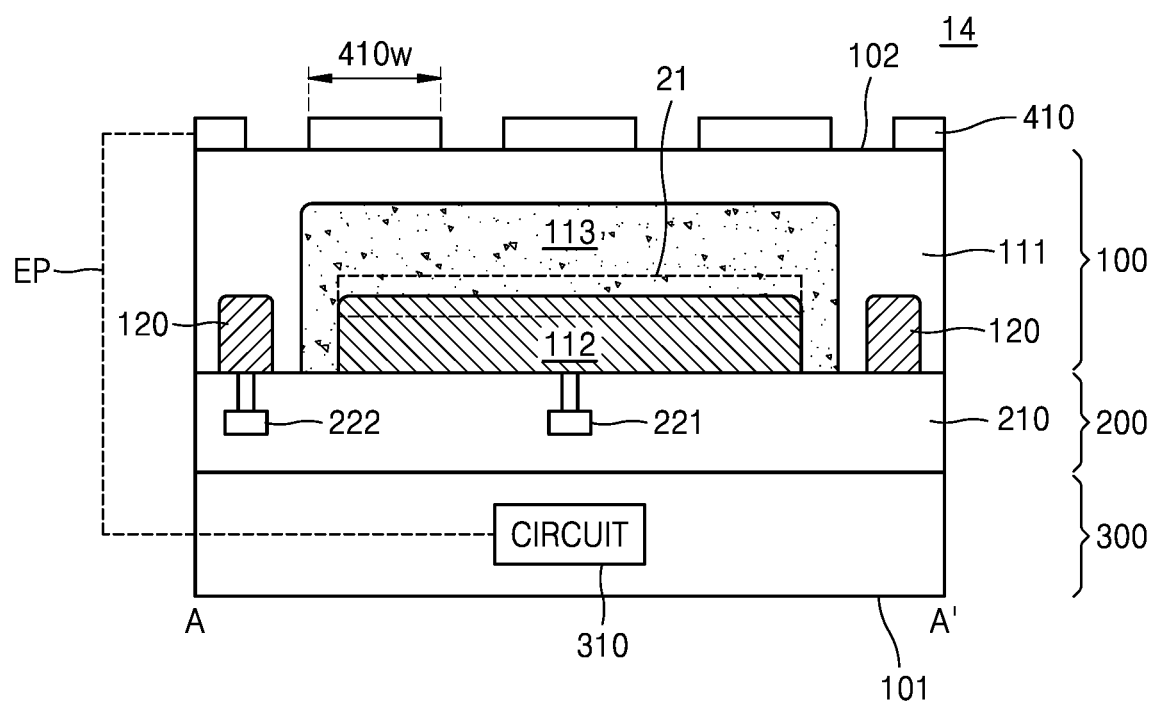
FIG. 16 is a cross-sectional view taken along line A-A' of FIG. 1 of a single-photon detection element, according to an embodiment.

FIG. 16 is a cross-sectional view taken along line A-A' of FIG. 1 of a single-photon detection element, according to an embodiment. For brevity of explanation, the same description as that made with reference to FIGS. 1 and 2 will be omitted.

Referring to FIG. 16, a single-photon detection element 14 may be provided. The single-photon detection element 14 may include the substrate 100, the connection layer 200, the control layer 300, and the plasmonic nanopatterns 410. The substrate 100, the connection layer 200, the control layer 300, and the plasmonic nanopatterns 410 may be respectively substantially the same as the substrate 100, the connection layer 200, the control layer 300, and the plasmonic nanopatterns 410 of FIGS. 1 and 2.

The plasmonic nanopatterns 410 may be used as electrodes. For example, the circuit 310 may be electrically connected to the plasmonic nanopatterns 410 by an electrical connection path EP to apply a voltage to the plasmonic nanopatterns 410. A voltage applied to the plasmonic nanopatterns 410 may be determined as necessary. In an example, a magnitude of a voltage applied to the plasmonic nanopatterns 410 may be different from a magnitude of a voltage applied to the contact region 120. In another example, a magnitude of a voltage applied to the plasmonic nanopatterns 410 may be substantially the same as a magnitude of a voltage applied to the contact region 120. The electrical connection path EP may be configured as necessary. Although it is shown that one plasmonic nanopattern 410 is electrically connected to the circuit 310, this is merely an example. In another example, two or more plasmonic nanopatterns 410 may be electrically connected to the circuit 310.

A voltage may be applied to the substrate region 111 through the plasmonic nanopatterns 410 and the contact region 120, and electrical injection characteristics of a Schottky junction between the plasmonic nanopatterns 410 and the substrate 100 may be adjusted.

In another example, unlike in FIG. 16, the single-photon detection element 14 may not include the contact region 120 and the second conductive line 222. A voltage for adjusting electrical injection characteristics of a Schottky junction between the plasmonic nanopatterns 410 and the substrate 100 may be applied to the substrate region 111 through the contact region 120.

Figure 17:
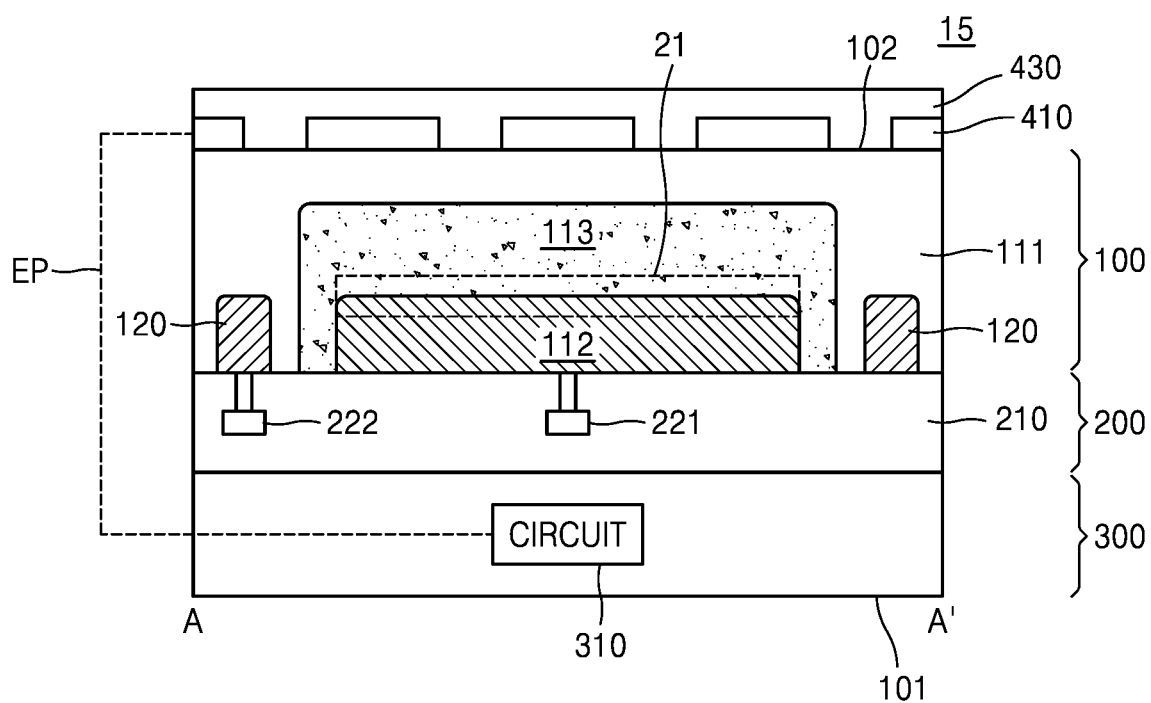
FIG. 17 is a cross-sectional view taken along line A-A' of FIG. 1 of a single-photon detection element, according to an embodiment.

FIG. 17 is a cross-sectional view taken along line A-A' of FIG. 1 of a single-photon detection element, according to an embodiment. For brevity of explanation, the same description as that made with reference to FIG. 16 will be omitted.

Referring to FIG. 17, a single-photon detection element 15 may be provided. The single-photon detection element 15 may include the substrate 100, the connection layer 200, the control layer 300, the plasmonic nanopatterns 410, and an additional layer 430. The substrate 100, the connection layer 200, the control layer 300, and the plasmonic nanopatterns 410 may be respectively substantially the same as the substrate 100, the connection layer 200, the control layer 300, and the plasmonic nanopatterns 410 of FIG. 16. The additional layer 430 may be provided on the plasmonic nanopatterns 410. The plasmonic nanopatterns 410 may be located between the additional layer 430 and the substrate 100.

In an example, the additional layer 430 may include a transparent electrode (e.g., ITO). The plasmonic nanopatterns 410 may be electrically connected to each other by the transparent electrode. Accordingly, when a voltage is applied to any one plasmonic nanopattern 410 electrically connected to the circuit 310, a voltage may be applied to the other plasmonic nanopatterns 410.

In another example, the additional layer 430 may be a layer for improving or modulating light absorption characteristics of the plasmonic nanopatterns 410.

Figure 18:
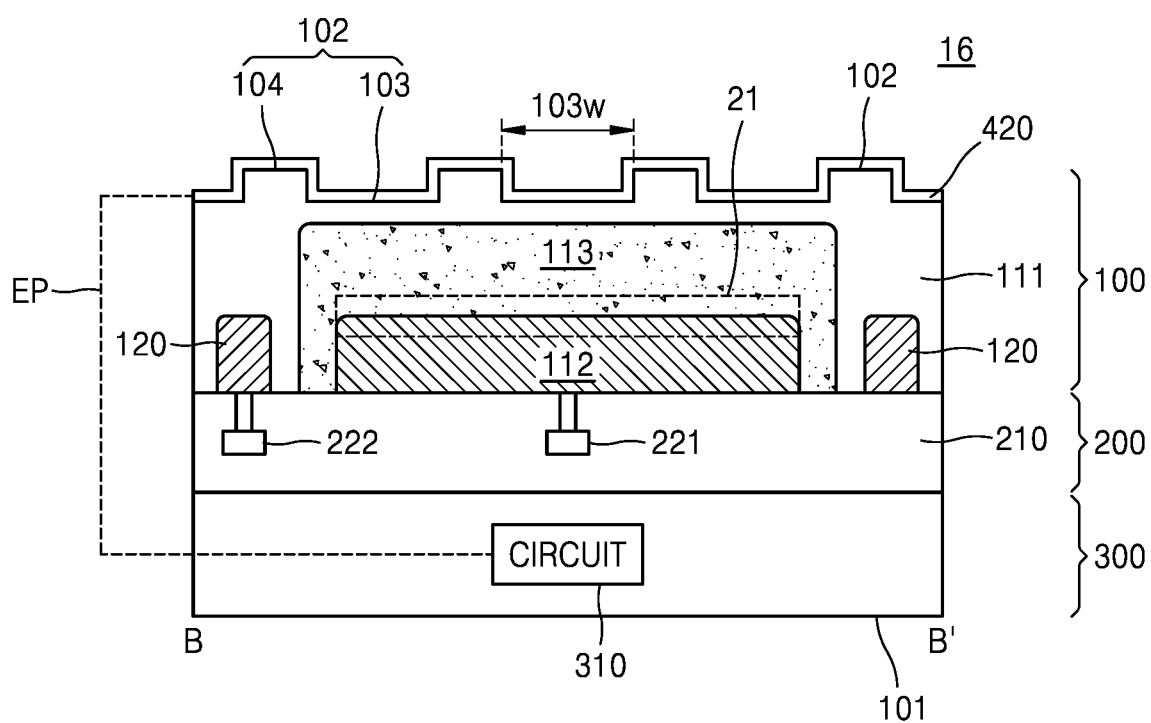
FIG. 18 is a cross-sectional view taken along line B-B' of FIG. 3 of a single-photon detection element, according to an embodiment.

FIG. 18 is a cross-sectional view taken along line B-B' of FIG. 3 of a single-photon detection element, according to an embodiment. For brevity of explanation, the same description as that made with reference to FIGS. 3 and 4 will be omitted.

Referring to FIG. 18, a single-photon detection element 16 may be provided. The single-photon detection element 16 may include the substrate 100, the connection layer 200, the control layer 300, and the plasmonic nanolayer 420. The substrate 100, the connection layer 200, the control layer 300, and the plasmonic nanolayer 420 may be respectively substantially the same as the substrate 100, the connection layer 200, the control layer 300, and the plasmonic nanolayer 420 of FIGS. 3 and 4.

The plasmonic nanolayer 420 may be used as an electrode. For example, the circuit 310 may be electrically connected to the plasmonic nanolayer 420 through the electrical connection path EP, to apply a voltage to the plasmonic nanolayer 420. A voltage applied to the plasmonic nanolayer 420 may be determined as necessary. In an example, a magnitude of a voltage applied to the plasmonic nanolayer 420 may be different from a magnitude of a voltage applied to the contact region 120. In another example, a magnitude of a voltage applied to the plasmonic nanolayer 420 may be substantially the same as a magnitude of a voltage applied to the contact region 120. The electrical connection path EP may be configured as necessary. A voltage may be applied to the substrate region 111 through the plasmonic nanolayer 420 and the contact region 120, and electrical junction characteristics of a Schottky junction between the plasmonic nanolayer 420 and the substrate 100 may be adjusted.

In another example, unlike in FIG. 18, the single-photon detection element 16 may not include the contact region 120 and the second conductive line 222. A voltage for adjusting electrical injection characteristics of a Schottky junction between the plasmonic nanolayer 420 and the substrate 100 may be applied to the substrate region 111 through the contact region 120.

Figure 19:
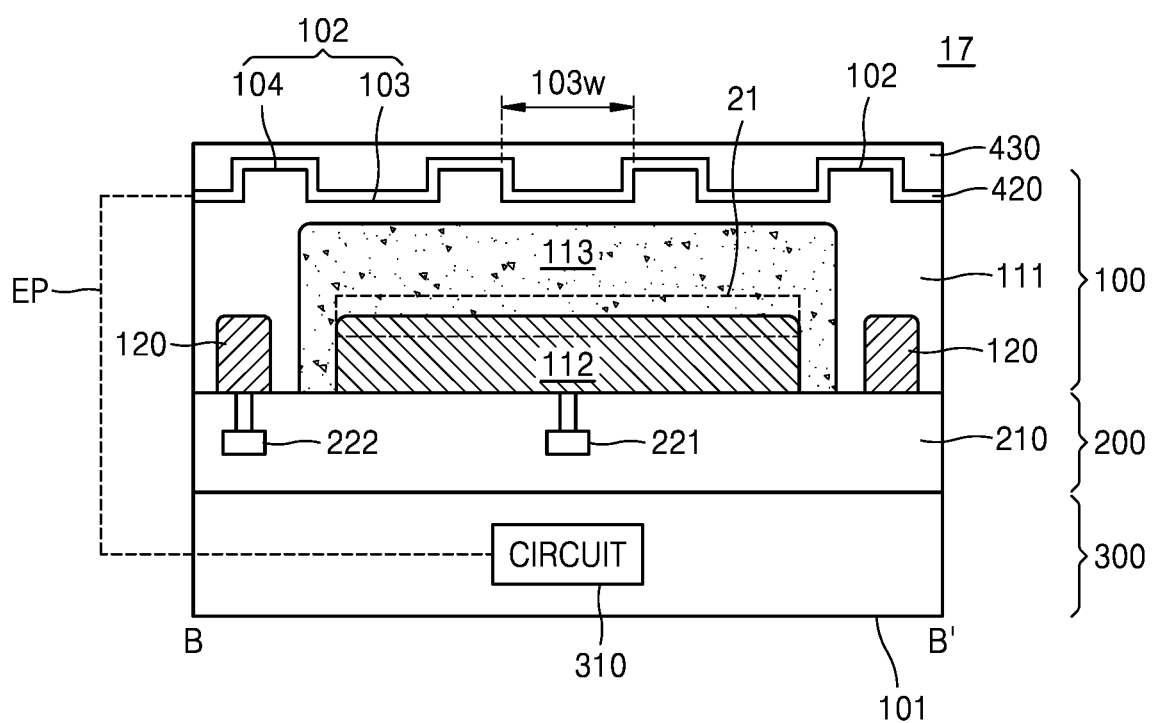
FIG. 19 is a cross-sectional view taken along line B-B' of FIG. 3 of a single-photon detection element, according to an embodiment.

FIG. 19 is a cross-sectional view taken along line B-B' of FIG. 3 of a single-photon detection element, according to an embodiment. For brevity of explanation, the same description as that made with reference to FIG. 18 will be omitted.

Referring to FIG. 19, a single-photon detection element 17 may be provided. The single-photon detection element 17 may include the substrate 100, the connection layer 200, the control layer 300, the plasmonic nanolayer 420, and the additional layer 430. The substrate 100, the connection layer 200, the control layer 300, and the plasmonic nanolayer 420 may be respectively substantially the same as the substrate 100, the connection layer 200, the control layer 300, and the plasmonic nanolayer 420 of FIG. 18. The additional layer 430 may be provided on the plasmonic nanolayer 420. The plasmonic nanolayer 420 may be located between the additional layer 430 and the substrate 100.

In an example, the additional layer 430 may include a transparent electrode (e.g., ITO). In another example, the additional layer 430 may be a layer for improving or modulating light absorption characteristics of the plasmonic nanolayer 420.

Figure 20:
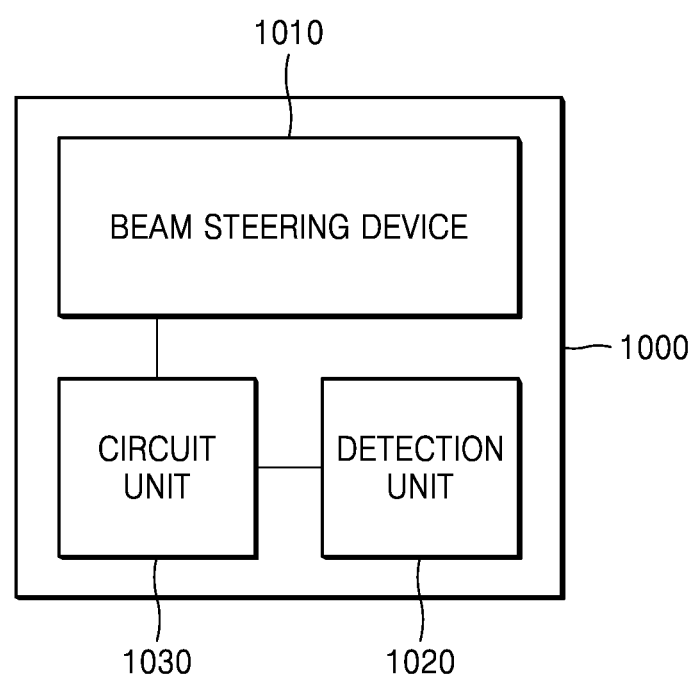
FIG. 20 is a block diagram for describing an electronic device, according to an embodiment.

FIG. 20 is a block diagram for describing an electronic device, according to an embodiment.

Referring to FIG. 20, an electronic device 1000 may be provided. The electronic device 1000 may emit light to an object (not shown), and may detect light reflected from the object to the electronic device 1000. The electronic device 1000 may include a beam steering device 1010. The beam steering device 1010 may adjust a direction of light emitted to the outside of the electronic device 1000. The beam steering device 1010 may be a mechanical or non-mechanical (semiconductor type) beam steering device. The electronic device 1000 may include a light source unit in the beam steering device 1010, or may include a light source unit located outside the beam steering device 1010. The beam steering device 1010 may be a light-emitting device using a scanning method. However, the light-emitting device of the electronic device 1000 is not limited to the beam steering device 1010. In another example, the electronic device 1000 may include a light-emitting device using a flash method, instead of or along with the beam steering device 1010. The light-emitting device using the flash method may emit light to an area including all fields of view at once without a scanning process.

Light steered by the beam steering device 1010 may be reflected by the object to the electronic device 1000. The electronic device 1000 may include a detection unit 1020 for detecting light reflected by the object. The detection unit 1020 may include a plurality of light detection elements, and may further include other optical members. The plurality of light detection elements may include any one of the single-photon detection elements 1, 2, 3, 4, 5, 6, 7, 8, 9, 10, 11, 12, 13, 14, 15, 16, and 17 described above. Also, the electronic device 1000 may further include a circuit unit 1030 connected to at least one of the beam steering device 1010 and the detection unit 1020. The circuit unit 1030 may include a calculation unit that obtains and calculates data, and may further include a driver and a controller. Also, the circuit unit 1030 may further include a power supply unit and a memory.

Although the electronic device 1000 includes the beam steering device 1010 and the detection unit 1020 in one device, the beam steering device 1010 and the detection unit 1020 may not be provided in one device but may be provided in separate devices.

Also, the circuit unit 1030 may be connected to the beam steering device 1010 or the detection unit 1020 through wireless communication rather than wired communication.

The electronic device 1000 according to the above embodiment may be applied to various electronic devices. For example, the electronic device 1000 may be applied to a light detection and ranging (LiDAR) device. The LiDAR device may be a phase-shift type or time-of-flight (TOF) type device. Also, any of the single-photon detection elements 1, 2, 3, 4, 5, 6, 7, 8, 9, 10, 11, 12, 13, 14, 15, 16, and 17 or the electronic device 1000 including the same according to an embodiment may be mounted on an electric device such as a smartphone, a wearable device (e.g., augmented reality and virtual reality glasses), an Internet of things (IoT) device, a home appliance, a tablet personal computer (PC), a personal digital assistant (PDA), a portable multimedia player (PMP), a navigation device, a drone, a robot, a self-driving vehicle, an autonomous vehicle, or an advanced driver-assistance system (ADAS).

Figure 21:
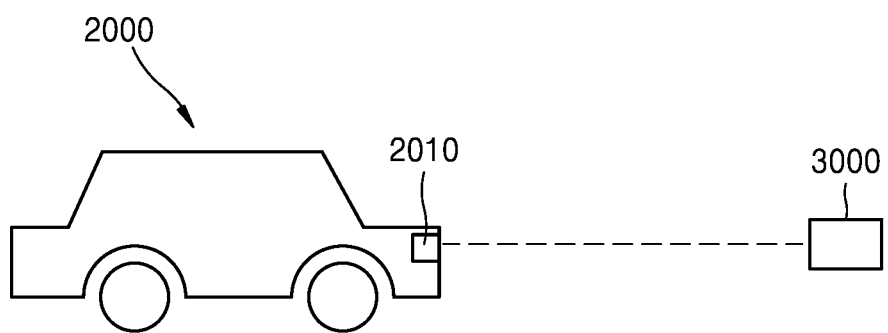
FIGS. 21 and 22 are conceptual views illustrating a case where a light detection and ranging (LiDAR) device is applied to a vehicle, according to an embodiment.
Figure 22:
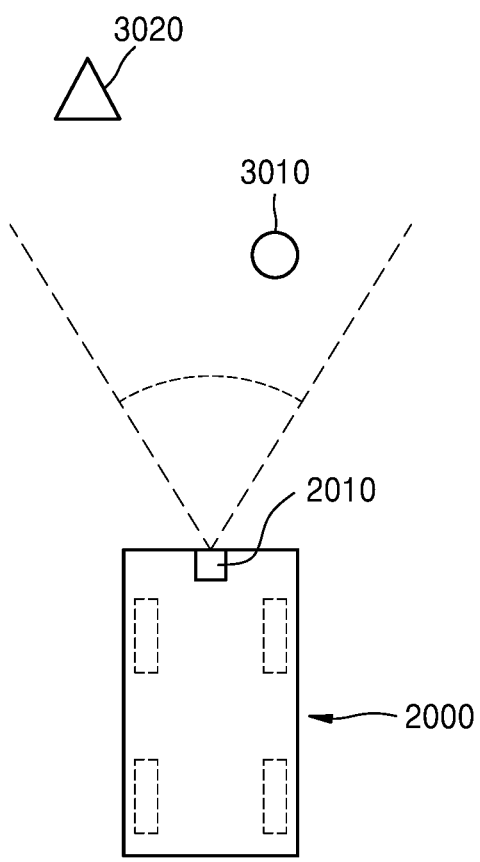

FIGS. 21 and 22 are conceptual views illustrating a case where a light detection and ranging (LiDAR) device is applied to a vehicle, according to an embodiment.

Referring to FIGS. 21 and 22, a LiDAR device 2010 may be applied to a vehicle 2000, and information about an object 3000 may be obtained by using the LiDAR device 2010. The vehicle 2000 may be an autonomous vehicle. The LiDAR device 2010 may detect a solid body or a person, that is, the object 3000, in a direction in which the vehicle 2000 travels. The LiDAR device 2010 may measure a distance to the object 3000, by using information such as a time difference between a transmitted signal and a detected signal. The LiDAR device 2010 may obtain information about a near object 3010 and a far object 3020 within a scan range. The LiDAR device 2010 may include the electronic device 1000 of FIG. 20.

Although the LiDAR device 2010 is located on a front portion of the vehicle 2000 and detects the object 3000 in a direction in which the vehicle 2000 travels, the disclosure is not limited thereto. In another example, the LiDAR device 2010 may be located at a plurality of locations on the vehicle 2000 to detect all objects 3000 around the vehicle 2000. For example, four LiDAR devices 2010 may be located on a front portion, a rear portion, and left and right portions of the vehicle 2000. In another example, the LiDAR device 2010 may be located on a roof of the vehicle 2000, and may rotate and detect all objects 3000 around the vehicle 2000.

The disclosure may provide a single-photon detection element, an electronic device, and a LiDAR device in which a photon with energy lower than a bandgap of a material of a semiconductor substrate may be detected.

The disclosure may provide a single-photon detection element, an electronic device, and a LiDAR device in which short-wavelength infrared rays may be detected.

The disclosure may provide a single-photon detection element, an electronic device, and a LiDAR device having better near-infrared efficiency.

However, effects of the disclosure are not limited thereto.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A single-photon detection element comprising:
   a substrate comprising a first surface and a second surface located opposite to each other; and
   a plurality of plasmonic nanopatterns provided on the second surface,
   wherein the substrate further comprises a high-concentration doping region provided adjacent to the first surface, a substrate region provided between the high-concentration doping region and the plurality of plasmonic nanopatterns, and a first well provided between the substrate region and the high-concentration doping region,
   wherein the first well has a first conductivity type, and the high-concentration doping region has a second conductivity type different from the first conductivity type.

2. The single-photon detection element of claim 1, wherein the second surface is exposed between the plurality of plasmonic nanopatterns.

3. The single-photon detection element of claim 2, wherein the plurality of plasmonic nanopatterns protrude from the second surface.

4. The single-photon detection element of claim 1, wherein a width of each of the plurality of plasmonic nanopatterns ranges from several nanometers (nm) to several micrometers (µm).

5. The single-photon detection element of claim 1, wherein the second surface comprises a plurality of concave portions and a connection portion provided between the plurality of concave portions, and
the plurality of plasmonic nanopatterns are respectively provided in the plurality of concave portions.

6. The single-photon detection element of claim 5, wherein the plurality of plasmonic nanopatterns conformably cover the plurality of concave portions.

7. The single-photon detection element of claim 5, further comprising a connection film provided on the connection portion,
wherein the connection film connects the plurality of plasmonic nanopatterns to each other.

8. The single-photon detection element of claim 7, wherein the plurality of plasmonic nanopatterns and the connection film are formed as a single structure.

9. The single-photon detection element of claim 1, further comprising an intermediate layer provided between the plurality of plasmonic nanopatterns and the second surface,
wherein the intermediate layer comprises at least one of an insulating film, an oxide thin film, and a two-dimensional (2D) material film.

10. The single-photon detection element of claim 1, further comprising a transparent electrode provided on the plurality of plasmonic nanopatterns,
wherein the transparent electrode electrically connects the plurality of plasmonic nanopatterns to each other.

11. The single-photon detection element of claim 1, further comprising an additional layer provided on the plurality of plasmonic nanopatterns,
wherein the additional layer improves light absorption characteristics of the plurality of plasmonic nanopatterns.

12. The single-photon detection element of claim 1, wherein a voltage is applied to at least one of the plurality of plasmonic nanopatterns.

13. The single-photon detection element of claim 1, further comprising:
a connection layer provided on the first surface; and
a control layer provided opposite to the substrate with the connection layer therebetween,
wherein the control layer comprises a circuit, and
the connection layer comprises a first conductive line that electrically connects the high-concentration doping region to the circuit, and a second conductive line that electrically connects the substrate region to the circuit,
wherein the circuit comprises a quenching circuit and a pixel circuit.

14. The single-photon detection element of claim 1, further comprising a second well provided between the high-concentration doping region and the first well,
wherein the second well has the second conductivity type, and
a doping concentration of the second well is lower than a doping concentration of the high-concentration doping region.

15. The single-photon detection element of claim 1, further comprising a contact region provided on a side surface of the high-concentration doping region,
wherein the contact region has the first conductivity type.

16. The single-photon detection element of claim 1, further comprising a guard ring provided on a side surface of the first well,
wherein the guard ring has the second conductivity type.

17. The single-photon detection element of claim 1, wherein a width of the high-concentration doping region is greater than a width of the first well.

18. The single-photon detection element of claim 1, wherein the substrate comprises an additional doping region adjacent to the second surface,
wherein charge injection characteristics of carriers excited in the plurality of plasmonic nanopatterns into the substrate are adjusted according to the additional doping region.

19. An electronic device comprising a single-photon detection element,
wherein the single-photon detection element comprises:
a substrate having a first surface and a second surface located opposite to each other; and
a plurality of plasmonic nanopatterns provided on the second surface,
wherein the substrate comprises a high-concentration doping region provided adjacent to the first surface, a substrate region provided between the high-concentration doping region and the plurality of plasmonic nanopatterns, and a first well provided between the substrate region and the high-concentration doping region,
wherein the first well has a first conductivity type, and
the high-concentration doping region has a second conductivity type different from the first conductivity type.

20. A light detection and ranging (LiDAR) device comprising an electronic device,
wherein the electronic device comprises a single-photon detection element, and
the single-photon detection element comprises:
a substrate comprising a first surface and a second surface located opposite to each other; and
a plurality of plasmonic nanopatterns provided on the second surface,
wherein the substrate comprises a high-concentration doping region provided adjacent to the first surface, a substrate region provided between the high-concentration doping region and the plurality of plasmonic nanopatterns, and a first well provided between the substrate region and the high-concentration doping region,
wherein the first well has a first conductivity type, and
the high-concentration doping region has a second conductivity type different from the first conductivity type.

* * * * *